United States Patent
Nagasawa

(10) Patent No.: US 11,862,460 B2
(45) Date of Patent: Jan. 2, 2024

(54) SIC MULTILAYER BODY, PRODUCTION METHOD THEREFOR, AND SEMICONDUCTOR DEVICE

(71) Applicant: CUSIC INC., Miyagi (JP)

(72) Inventor: Hiroyuki Nagasawa, Miyagi (JP)

(73) Assignee: CUSIC INC., Miyagi (JP)

( * ) Notice: Subject to any disclaimer, the term of this patent is extended or adjusted under 35 U.S.C. 154(b) by 0 days.

(21) Appl. No.: 17/921,409

(22) PCT Filed: Apr. 27, 2021

(86) PCT No.: PCT/JP2021/016865
§ 371 (c)(1),
(2) Date: Oct. 26, 2022

(87) PCT Pub. No.: WO2021/230076
PCT Pub. Date: Nov. 18, 2021

(65) Prior Publication Data
US 2023/0298886 A1    Sep. 21, 2023

(30) Foreign Application Priority Data

May 15, 2020  (JP) ................. 2020-085840

(51) Int. Cl.
*H01L 21/02* (2006.01)
*H01L 21/306* (2006.01)
(Continued)

(52) U.S. Cl.
CPC .... *H01L 21/02378* (2013.01); *H01L 21/0243* (2013.01); *H01L 21/02433* (2013.01);
(Continued)

(58) Field of Classification Search
CPC .......... H01L 21/02378; H01L 21/0243; H01L 21/02433; H01L 21/30625; H01L 21/8213;
(Continued)

(56) References Cited

U.S. PATENT DOCUMENTS

| | | |
|---|---|---|
| 4,912,064 A | 3/1990 | Kong et al. |
| 5,011,549 A | 4/1991 | Kong et al. |

(Continued)

FOREIGN PATENT DOCUMENTS

| | | |
|---|---|---|
| JP | 11162850 A | 6/1999 |
| JP | 2000214593 A | 8/2000 |

(Continued)

OTHER PUBLICATIONS

Decision to Grant a Patent for Japanese Patent Application No. 2020-085840; Date of Drafting—Sep. 23, 2020; Applicant—Cusic Inc., 1-3.

(Continued)

*Primary Examiner* — Julia Slutsker
(74) *Attorney, Agent, or Firm* — CANTOR COLBURN LLP

(57) ABSTRACT

According to one embodiment, a method of producing a SiC laminate having a hexagonal SiC layer and a 3C-SiC layer comprises: forming a seed plane parallel to a close-packed plane of the crystal lattice on the surface of the hexagonal SiC layer; providing an inclined plane, which is inclined with respect to the seed plane, to all faces adjacent to the seed plane; forming a two-dimensional nucleus of 3C-SiC on the seed plane; and epitaxially growing both the two-dimensional nucleus of 3C-SiC and the SiC layers exposed on the inclined plane simultaneously in a direction parallel to the close-packed plane of the crystal lattice.

10 Claims, 11 Drawing Sheets

(51) Int. Cl.
  *H01L 21/82* (2006.01)
  *H01L 29/04* (2006.01)
  *H01L 29/16* (2006.01)
  *H01L 29/872* (2006.01)

(52) U.S. Cl.
  CPC .... *H01L 21/30625* (2013.01); *H01L 21/8213* (2013.01); *H01L 29/045* (2013.01); *H01L 29/1608* (2013.01); *H01L 29/872* (2013.01)

(58) Field of Classification Search
  CPC .. H01L 29/045; H01L 29/1608; H01L 29/872
  See application file for complete search history.

(56) References Cited

U.S. PATENT DOCUMENTS

| | | |
|---|---|---|
| 6,461,944 B2 | 10/2002 | Neudeck et al. |
| 2020/0056302 A1 | 2/2020 | Balachandran et al. |

FOREIGN PATENT DOCUMENTS

| | | |
|---|---|---|
| JP | 2002226300 A | 8/2002 |
| JP | 2003068655 A | 3/2003 |
| JP | 2004152813 A | 5/2004 |
| JP | 2018035051 A | 3/2018 |
| WO | 2008056698 A1 | 2/2010 |
| WO | 2014034080 A1 | 3/2014 |

OTHER PUBLICATIONS

Henry et al., "CVD Growth of 3C-Sic on 4H-Sic Substrate," Materials Science Forum, (2012), vol. 711, 16-21.
International Search Report; International Application No. PCT/JP2021/016865; International Filing Date—Apr. 27, 2021; dated Jul. 20, 2021; 2 pages.
Japanese Office Action mailed Jul. 28, 2021, issued for Japanese Patent Application No. 2020-085840; Date of Drafting - Jun. 26, 2020; Applicant - Cusic Inc., 1-3.

FIG.3
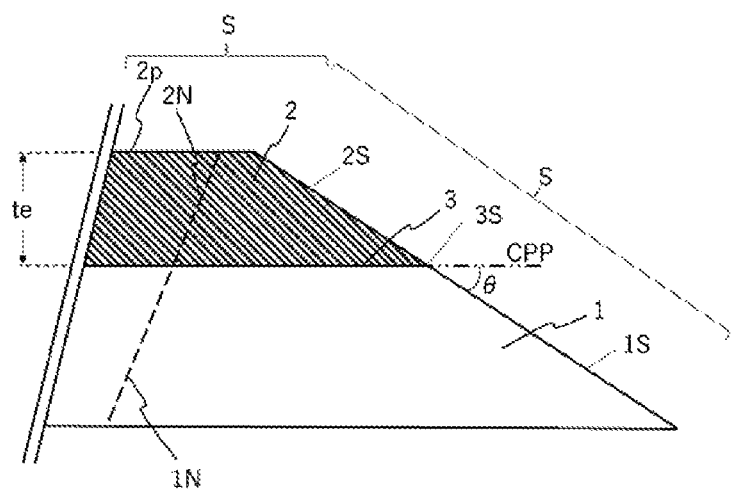
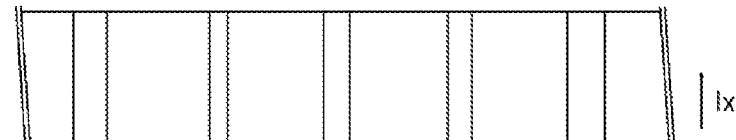
FIG.4(a)
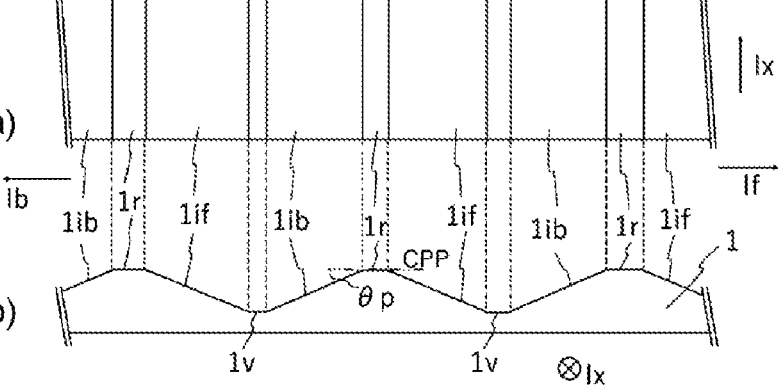
FIG.4(b)

TOP VIEW

CROSS-SECTIONAL VIEW

TOP VIEW

CROSS-SECTIONAL VIEW

SIC MULTILAYER BODY, PRODUCTION METHOD THEREFOR, AND SEMICONDUCTOR DEVICE

CROSS REFERENCE TO RELATED APPLICATIONS

This application is a National Stage application of PCT/JP2021/016865, filed Apr. 27, 2021, which claims priority to JP Application No. 2020-085840, filed May 15, 2020, and all the benefits accruing therefrom under 35 U.S.C. § 119, the content of which is incorporated by reference in its entirety.

TECHNICAL FIELD

The present invention relates to a SiC laminate preferably used as a substrate for power semiconductor devices and integrated circuits that operate at high temperature, high power density, and high frequency, a method of producing the same, and a semiconductor device using the same.

BACKGROUND

Rectifiers and switching devices that uses single-crystal silicon carbide (SiC) as a substrate material have been put to practical use in electric equipment such as trains and air conditioners, industrial power supplies, home appliances, and the like. The single-crystal SiC substrate mainly used for manufacturing these semiconductor devices is a 4H-SiC substrate with a band gap ($E_g$) of 3.2 eV. This wide band gap enables both an improvement in the breakdown voltage ($V_b$) of semiconductor devices and a reduction in the specific on-resistance ($R_{on}$), thereby reducing the loss during power conversion. The step-controlled epitaxy technique as disclosed in Patent Document 1 (U.S. Pat. No. 4,912,064 A) and Patent Document 2 (U.S. Pat. No. 5,011,549 A), as well as the large-area SiC bulk crystal growth technique, has contributed to the practical application of such SiC semiconductor devices. This technique is a method for, when a homoepitaxially grown layer is provided on a hexagonal SiC substrate, tilting the substrate surface in a specific direction from a close-packed plane (CPP) of the crystal lattice, where the epitaxially grown layer faithfully inherits the crystal structure of the substrate. The step-controlled epitaxy provides homoepitaxial films with a smooth surface and low crystal defect density, along with a high epitaxial growth rate over a wide range of epitaxial growth conditions.

4H-SiC has a high breakdown voltage because of its wide band gap. On the other hand, the wide band gap is also a cause of impairing the low loss performance and long-term reliability of switching devices. For example, in a metal-oxide-semiconductor field-effect transistor (MOSFET) using a 4H-SiC substrate, the interface state density ($D_{it}$) is high at the interface between the oxide film and the semiconductor (MOS interface), which increases the channel resistance ($R_{ch}$) and interferes with the reduction of the on-resistance. For another example, basal plane dislocations in the epitaxially grown layer move upon the annihilation of electron-hole pairs, which causes stacking faults (SFs) to extend, resulting in the instability of the on-resistance. To avoid these obstacles, device structure and manufacturing process innovations, such as the provision of a recombination promoting layer to trench-structure MOSFETs or at the bottom of the drift layer, are being promoted. However, the countermeasures have led to an increase in device manufacturing costs and a decrease in yield.

Meanwhile, 3C-SiC is the only one that has a cubic crystal structure among the polytypes of SiC and exhibits a band gap of 2.3 eV, which is about 1 eV narrower than that of 4H-SiC. Owing to this narrow band gap, the interface state density at the MOS interface of 3C-SiC is about two orders of magnitude lower than that of 4H-SiC. Therefore, 3C-SiC can be used to produce low-loss, high-speed switching devices. However, semiconductor devices using 3C-SiC have not yet reached practical application due to their low yield and high manufacturing cost, as a complex process is required to produce a 3C-SiC substrate with low stacking fault density.

As mentioned above, since the physical properties of SiC vary greatly depending on the crystal structure, there have been proposed methods which use SiC layers with different crystal structures to achieve desired semiconductor device characteristics. For example, Patent Document 3 (WO 2008/056698 A1) discloses a method in which an extended terrace surface is formed on a part of the surface of hexagonal SiC such as 4H-SiC, a 3C-SiC portion with low interface state density is formed thereon, and an n-channel MOSFET is formed on this portion. In this structure, the maximum electric field region of the semiconductor device is located in the hexagonal SiC with high breakdown electric field, and the low interface state density of the 3C-SiC portion thereon reduces the channel resistance. As a result, the on-resistance can be reduced without compromising the breakdown voltage of the semiconductor device. In addition, the extended terrace surface can be obtained by coating the hexagonal SiC with Si and heat-treating it, and supersaturation increases during epitaxial growth on the extended terrace surface. Accordingly, a 3C-SiC portion can be formed in a desired location to form a channel with low resistance.

Patent Document 4 (JP 2004-152813 A) discloses a semiconductor device excellent in high-speed operation using a 3C-SiC/6H-SiC layered structure and a manufacturing method thereof. In the structure of this semiconductor device, the channel region where electrons drift is located on the 3C-SiC side, while holes are localized on the 6H-SiC side to suppress the scattering of electrons in the channel and speed up the operation of the semiconductor device.

Patent Document 5 (JP 2018-035051 A) discloses a structure in which a cubic close-packed (CCP) structure is formed on the outermost surface of hexagonal SiC and a manufacturing method thereof. In this structure, only the desired close-packed structure is obtained by utilizing the fact that the etching rate and growth rate of atomic steps exposed on the surface differ depending on the close-packed structure. For example, by performing heat treatment at a temperature of 350° C. or more and 600° C. or less in a hydrogen gas atmosphere, three molecular layers on the hexagonal SiC surface are covered with a CCP structure. By using this method to obtain a stacked structure in which only a predetermined close-packed structure forms an interface, the mobility of electrons can be increased, making it possible to produce semiconductor devices with high speed and low loss.

Patent Document 6 (JP H11-162850 A) discloses a technology in which, when SiC is epitaxially grown, the surface of a hexagonal SiC or 3C-SiC substrate is inclined at 0.05 degrees or more and 10 degrees or less from a close-packed plane of the crystal lattice to supply Si atoms in excess of C atoms so that 3C-SiC can be epitaxially grown on the hexagonal SiC even at a low temperature of 1300° C. or less. Through this method, a layered structure is formed by performing step-controlled epitaxy after providing 3C-SiC on hexagonal SiC, and a 3C-SiC layer can be formed in a predetermined region. In addition, it is possible to obtain hexagonal SiC and 3C-SiC layers having an interface where the crystal structure changes abruptly.

Non-Patent Document 1 (Anne Henry et al., "CVD growth of 3C-SiC on 4H-SiC substrate," Materials Science Forum Vol. 711, pp. 16-21, 2012) discloses the optimum temperature and composition of source gases for obtaining high-quality 3C-SiC on on-axis 4H-SiC.

Patent Document 7 (JP 2003-068655 A) discloses a method of manufacturing compound single crystals by epitaxially growing a compound single-crystal layer on the surface of a different compound single-crystal substrate. In this method, at least a portion of the surface of the single-crystal substrate has a plurality of undulations extending in a specific direction, and the undulations are provided such that defects that grow along with the epitaxial growth of the compound single-crystal layer meet one another. The method allows the fabrication of a structure with layers of different types of semiconductor single crystals and reduces the defect density in the epitaxially grown layer. Thereby, a high-performance semiconductor device can be achieved.

Patent Document 8 (U.S. Pat. No. 6,461,944 B2) discloses a method of producing single-crystal structures with cantilevered web features on a single-crystal substrate and a method for obtaining an epitaxially grown layer with a layered structure of the same or different crystals on a substrate. First, a single-crystal substrate having a surface which exhibits crystal properties is prepared, and step-controlled epitaxy is applied to the surface to obtain a first epitaxially grown layer. The layer has a surface parallel to an angle inclined with respect to a given crystallographic orientation. Next, the first epitaxially grown layer is patterned to define a separated second growth surface. At this stage, the two-dimensional pattern is provided with a concave portion. Then, after removal of crystal nuclei on the second growth surface, step-controlled epitaxy is performed along with the suppression of two-dimensional nucleation. As a result, the epitaxially grown layer extends laterally to form a continuous crystal structure as a third layer in the concave portion of the two-dimensional pattern. In this method, since the third layer is separated from the substrate by a gap, the third layer does not inherit the structure of crystal defects on the substrate side, and a high-quality epitaxially grown layer can be achieved. Additionally, a crystal of a desired size can be obtained in a desired location by adjusting the size and arrangement of the web-shaped two-dimensional pattern, the growth duration of the third layer, and the like. Furthermore, through the application of this method to SiC, 3C-SiC can be formed on a hexagonal crystal substrate, and it is also possible to obtain a coherent interface as the interface where the second layer is in contact with the substrate.

SUMMARY

Despite the above technical achievements, semiconductor devices using a SiC laminate composed of stacked layers of different polytypes have not yet been put to practical use. The main reason for this is that a coherent interface (an interface where the continuity of the crystal lattice is maintained) is not always formed at the heterointerface of different polytypes, which suppresses the mobility of carriers (charged particles that carry charges, which herein refer to electrons and holes). In addition, a twin boundary (TB) in part of a SiC laminate causes the trapping and scattering of carriers, degrading the characteristics of semiconductor devices. For example, in the method disclosed in Patent Document 3, not all Si-coated portions become atomically flat extended terraces, but kink planes are also formed due to step bunching. The kink planes are incoherent interfaces (interfaces where the crystal lattice is discontinuous), and they cause the scattering and trapping of carriers, thus degrading the characteristics of semiconductor devices. In addition, 3C-SiC portions separated by a kink plane have a twinning relationship with a probability of 50%, and the smoothness of the interface between 3C-SiC and hexagonal SiC is compromised, which causes a problem that some of the carriers drifting through the channel are scattered at the twin boundary, increasing the channel resistance.

The flatness of the interface between 3C-SiC and 6H-SiC layers obtained by the method disclosed in Patent Document 4 depends on the flatness of the surface of the 6H-SiC layer itself. As long as the step-controlled epitaxy disclosed in Patent Document 1 or 2 is used to form the SiC layers, it is impossible to make the interface between 3C-SiC and 6H-SiC atomically flat, and the scattering of electrons at the stepped interface increases the channel resistance of MOSFETs.

The method disclosed in Patent Document 5 can produce a hexagonal SiC substrate whose surface is covered only with a cubic close-packed (CCP) structure. However, if 3C-SiC is epitaxially grown thereon using the step-controlled epitaxy of Patent Document 1 or 2, the layered structure of the hexagonal SiC propagates parallel to the close-packed plane, and part of the surface is covered with SiC of a hexagonal close-packed (HCP) structure. Therefore, a 3C-SiC epitaxially grown layer surface cannot be obtained. Even if 3C-SiC is grown by applying atomic layer epitaxy in the direction of the normal axis of the surface with the CCP structure, the interface between 3C-SiC and hexagonal SiC is not exactly parallel to the close-packed plane as long as the surface of the hexagonal SiC substrate is slightly inclined from the close-packed plane due to tolerance. Carriers drifting around the interface are scattered at the incoherent interface, increasing the on-resistance of semiconductor devices.

With the method disclosed in Patent Document 6, it is difficult to maintain a specific close-packed structure on a hexagonal SiC surface inclined from the CPP. 3C-SiC layers may be formed by adjusting the abundance ratio of Si and C and the temperature; however, the 3C-SiC layers inevitably have a twinning relationship since there is no mechanism to intentionally orient specific crystal planes of 3C-SiC on the surface of a hexagonal SiC substrate in a specific direction. As a result, the on-resistance of semiconductor devices increases. If the method disclosed in Patent Document 5 is used in combination and step-controlled epitaxy is performed after the top surface is covered only with a CCP structure, the interface between 3C-SiC and hexagonal SiC is not always parallel to the CPP, which leads to the occurrence of incoherent interfaces, stacking faults, and the like. Even if the interface between 3C-SiC and hexagonal SiC coincidentally aligns in the CPP, the phases of the stacking sequence of all CCP structures do not always match. Therefore, incoherent interfaces and stacking faults cannot be completely eliminated, leaving the possibility that the reliability and performance of semiconductor devices may be degraded. Furthermore, it is difficult to obtain epitaxially grown layers of 3C-SiC and hexagonal SiC simultaneously because the epitaxial growth conditions to obtain 3C-SiC are different from those to obtain hexagonal SiC.

The on-axis SiC surface (parallel to a close-packed plane of the crystal lattice) used in the method disclosed in Non-Patent Document 1 cannot be subjected to step-controlled epitaxy, and therefore the stacking sequence of the close-packed structures cannot be propagated accurately to the top layer thereof. For this reason, twin boundaries cannot be completely eliminated from the obtained 3C-SiC, and degradation in the characteristics of semiconductor devices is inevitable.

In the method disclosed in Patent Document 7, undulations are provided such that defects meet one another along with epitaxial growth, and the substrate surface inevitably has to become a non-polar plane or a semi-polar plane different from the CPP of the crystal lattice. Accordingly, when 3C-SiC is epitaxially grown on a hexagonal SiC substrate by this method, the heterointerface cannot be a coherent interface, and the carrier transport properties are impaired by scattering and trapping, resulting in high on-resistance of semiconductor devices.

In order to promote step-flow growth through the method disclosed in Patent Document 8, two-dimensional nucleation needs to be suppressed, and the thickness cannot be increased upon obtaining the third layer. After the third layer is formed, the layer can be used as a substrate to increase the layer thickness further in the direction of the normal axis of the substrate surface. However, since the third layer is separated from other regions by steps and gaps, a 3C-SiC surface and a hexagonal SiC surface cannot be present on the same plane, which interferes with the design and manufacturing process of semiconductor devices. In addition, in the process of step-controlled epitaxy of the third layer, considering the amount of impurities incorporated into the epitaxial film and the occurrence of lattice distortion due to differences in the thermal expansion coefficient, not all cantilevers extending from the third layer are necessarily parallel. Therefore, it is not always possible to obtain a film with a continuous crystal lattice. Moreover, there are crystallographic restrictions on the patterning shape of the second layer, and the shape and arrangement of the pattern need to take into account the initial tilt orientation and tilt angle of the substrate, which restricts the degree of flexibility in material design. Furthermore, the gap between the third layer and the substrate narrows the current path in vertical semiconductor devices, resulting in an increase in the on-resistance.

The present invention has been made in view of the above problems, and it is an object of the present invention to provide a SiC laminate and a method of producing the same for preventing deterioration of the characteristics of semiconductor devices using the SiC laminate as a substrate. The SiC laminate is characterized by its structure having a heterointerface between a hexagonal SiC layer (1) and a 3C-SiC layer (2), which is entirely a coherent heterointerface (3) that is exactly parallel to a close-packed plane of the crystal lattice and maintains the continuity of the crystal lattice. It is also an object of the present invention to enable simultaneous epitaxial growth of SiC of different polytypes, thereby facilitating the reduction of manufacturing costs. It is further an object of the present invention to improve the degree of flexibility in device design as well as the performance and reliability of semiconductor devices by exposing a segment (3S) of the coherent heterointerface on the main surface (S) of the SiC laminate and separating the hexagonal SiC surface (1S) and the 3C-SiC surface (2S) without the scattering or trapping of carriers to allow the free arrangement of semiconductor devices suitable for each crystal structure.

Means for Solving the Problems

In order to solve the above-mentioned problems, the inventor has made intensive studies and found that nucleation of 3C-SiC can be promoted in a desired location by having planes parallel to the close-packed planes (CPPs) of the crystal lattice and inclined planes both present in a specific arrangement on the surface of the hexagonal SiC layer. The inventor has also found that, by combining this with step-controlled epitaxy, a 3C-SiC layer and a hexagonal SiC layer simultaneously grow epitaxially in the horizontal direction (parallel to the CPPs), and a coherent interface formed at the interface extends parallel to the CPPs as a coherent heterointerface and separates the 3C-SiC and hexagonal SiC surface without the scattering or trapping of carriers. Thus, the inventor has achieved the present invention.

As means for solving the problems, the present invention provides the following:

[1] A SiC laminate, comprising: a single crystal hexagonal SiC layer (1); and a single crystal 3C-SiC layer (2) overlaid on the hexagonal SiC layer (1), wherein the 3C-SiC layer (2) does not contain a twin boundary, a heterointerface where the 3C-SiC layer (2) and the hexagonal SiC layer (1) meet is exactly parallel to close-packed planes of crystal lattices of the layers and is a lattice-matched coherent heterointerface (3), all coherent heterointerfaces (3) are exposed on a main surface (S) at an inclination angle (θ) of 0.5 degrees or more and less than 73 degrees, and a segment (3S) of the coherent heterointerface (3) on the main surface (S) is a polygon or a straight line with no endpoint and separates a hexagonal SiC surface (1S) and a 3C-SiC surface (2S).

[2] The SiC laminate as set forth in [1] above, wherein assuming that close-packed planes (CPPs) of a crystal lattice of the hexagonal SiC layer (1) are stacked with a periodicity of n molecular layers (n is a natural number), {−1-11} planes (2N) of a crystal lattice of the 3C-SiC layer (2) are each parallel to each of crystal lattice planes (1N) having a three-fold symmetry relationship selected from {0-33-n} planes of the crystal lattice of the hexagonal SiC layer (1).

[3] A production method for the SiC laminate as set forth in [1] or [2] above, comprising: forming a seed plane (1p) parallel to the close-packed planes (CPPs) of the crystal lattice in one or more regions on the surface of the hexagonal SiC layer (1) (seed process); providing an inclined plane (1i) inclined at a positive depression angle (θp) of 0.5 degrees or more and less than 73 degrees with respect to the seed plane (1p) to all faces adjacent to the seed plane (1p) (off process); forming a two-dimensional nucleus (2e) of 3C-SiC on the seed plane (1p) (nucleation process); and epitaxially growing both the two-dimensional nucleus (2e) of 3C-SiC and the SiC layers exposed on the inclined plane (1i) simultaneously in a direction parallel to the close-packed planes (CPPs) of the crystal lattice (lateral epitaxy process).

[4] The production method as set forth in [3] above, wherein the inclined plane (1i) is arranged so as to divide the surface of the hexagonal SiC layer (1) in the off process, at least one inclined plane is a positively inclined plane (1if) inclined in a specific positive inclination direction (If), and at least one inclined plane is a negatively inclined plane (1ib) inclined in a negative inclination direction (Ib) opposite to the positive inclination direction (If).

[5] The production method as set forth in [4] above, further comprising: matching the positive inclination direction (If) to either a <11-20> direction or a <1-100> direction of the hexagonal SiC layer (1); and extending a ridge portion (1r) and a valley portion (1v), each corresponding to a boundary between the positively inclined plane (1if) and the negatively inclined plane (1ib), linearly in a division direction (Ix) of 88 degrees or more and 92 degrees or less from the positive inclination direction (If).

[6] The production method as set forth in any one of [3] to [5] above, wherein the thickness (te) of the two-dimensional nucleus (2e) of 3C-SiC formed on the seed plane (1p) is less than the product of the tangent of the inclination angle (θ) and L, where L is the minimum length in the inclination direction of the plane obtained by projecting each of inclined planes (1i) onto a close-packed plane (CPP) the crystal lattice.

[7] The production method as set forth in any one of [3] to [6] above, further comprising exposing the seed plane (1p) to a hydrogen gas pressure of 700 hPa or higher at a temperature of 300° C. to 550° C. for 1 hour or more prior to the nucleation process (surface structure stabilization process).

[8] A semiconductor device using the SiC laminate as set forth in [1] or [2] above, comprising: one or more n-channel metal-oxide-semiconductor field-effect transistors (NMOSFETs), wherein the channel region (Nch) of the NMOSFETs is formed only in the 3C-SiC layer (2).

[9] A semiconductor device using the SiC laminate as set forth in [1] or [2] above, comprising: one or more p-channel metal-oxide-semiconductor field-effect transistors (PMOSFETs), wherein the channel region (Pch) of the PMOSFETs is formed only in the hexagonal SiC layer (1).

[10] A semiconductor device using the SiC laminate as set forth in [1] or [2] above, comprising: one or more Schottky barrier diodes (SBDs), wherein the anode (An) of the SBDs is formed only on the hexagonal SiC surface (1S).

Note that, in Miller indices, which represent the orientation of planes in a SiC crystal, negative indices are generally indicated with a horizontal line (bar) written over the number; however, they are indicated herein with a minus sign (−) in front of the number as the bar indication is not available.

Effects of the Invention

SiC is a crystal in which carbon atoms (C) and silicon atoms (Si) are covalently bonded in a one-to-one manner, and its various physical properties have different values due to the diversity of the stacking sequence of the close-packed planes (CPPs) of the crystal lattice, called polytypes. Incidentally, the {0001} planes of hexagonal SiC correspond to the CPPs, and the {111} planes of 3C-SiC correspond to the CPPs.

If the relative positions of CPPs in a three-dimensional crystal lattice are represented by A, B, and C, the polytypes of SiC are classified into cubic SiC (3C-SiC) or hexagonal SiC. 3C-SiC is composed only of a cubic close-packed (CCP) structure with a stacking sequence of ABC or ACB. Hexagonal SiC periodically has a hexagonal close-packed (HCP) structure such as ABA stacking or ACA stacking. Since 3C-SiC has a narrower band gap ($E_g$) than other SiC polytypes, it has the lowest interface state density ($D_{it}$) at the metal-oxide-semiconductor (MOS) interface, which reduces the channel resistance ($R_{ch}$) of MOSFETs at the time of manufacturing them. On the other hand, hexagonal SiC such as 4H-SiC and 6H-SiC has a wider band gap than 3C-SiC and can reduce conduction losses while keeping the high-breakdown voltage ($V_b$).

For example, in the case of 4H-SiC, the stacking sequence of CPPs appearing on the surface can be either one of ABA or ACA stacking of the HCP structure and ABC or ACB stacking of the CCP structure. When 3C-SiC is formed on the surface of this 4H-SiC, 3C-SiC with a unit of CCP (CCP2) structure composed of ACB stacking sequence is formed on the surface where the close-packed structure of ABA or BAC is exposed, and 3C-SiC with a unit of CCP (CCP1) structure composed of ABC stacking sequence is formed on the surface where the close-packed structure of ACA or CAB is exposed. In other words, when the close-packed structure of the surface is not uniquely defined, such as in the case of hexagonal SiC whose surface is slightly inclined from the CPPs, a 3C-SiC layer formed thereon includes both the CCP1 and CCP2 structures, and a twin boundary (TB) is formed between them, which results in a high leakage current density. In addition, since the interface between hexagonal SiC and 3C-SiC is not flat and includes an incoherent interface, the on-resistance ($R_{on}$) increases due to the scattering and trapping of carriers.

With respect to the above problems, the present invention proposes a SiC laminate with a structure in which, although a hexagonal SiC layer (1) and a 3C-SiC layer (2) are stacked, the coherent heterointerface (3) is exactly parallel to a close-packed plane (CPP) as illustrated in FIG. 1. Because of this, a crystal lattice discontinuity does not occur at the coherent heterointerface (3), suppressing the scattering and trapping of carriers. In addition, the −1-111 planes (2N) of the 3C-SiC layer are parallel to three-fold symmetry planes (1N) selected from the {0-33-n} planes of the hexagonal SiC layer (where n is a natural number indicating the stacking periodicity of CPPs). Consequently, the 3C-SiC layer (2) does not contain a twin boundary (TB), and the leakage current is suppressed. It has not been possible to obtain such a coherent heterointerface (3) with conventional step-controlled epitaxy, which necessitates a slight inclination of the substrate surface with respect to the CPPs.

Furthermore, in the SiC laminate of the present invention, the coherent heterointerface (3) intersects with the main surface (S) of the SiC laminate at an inclination angle (θ), exposing a segment (3S) thereof to separate a hexagonal SiC surface (2S) and a 3C-SiC surface (1S). Thus, it is possible to separately arrange semiconductor devices suitable for the physical properties of their respective crystal structures on the surface. That is, by using the SiC laminate of the present invention as a substrate, it is possible to manufacture a plurality of types of semiconductor devices on the SiC substrate with the same planar technology as the Si semiconductor manufacturing process.

In order to realize the above SiC laminate, in the production method of the present invention, a seed plane (1p) parallel to a close-packed plane (CPP) is formed on the surface of the hexagonal SiC layer (1) (seed process) as illustrated in FIG. 2(a). Since the seed plane (1p) is microscopically smooth, the stacking sequence of CPPs on the seed plane is defined as one of ABA, ACA, CAB, and BAC, which suppresses the formation of twin boundaries in the 3C-SiC layer. Additionally, all inclined planes (1i) adjacent to the seed plane (1p) have a depression angle (θp) corresponding to the inclination angle (θ), and therefore the stacking sequence of the CPPs is exposed at the end of the seed plane (1p) and the surface of the inclined planes (1i). As a result, in the step-controlled epitaxy performed in the lateral epitaxy process (described later), the seed plane (1p)

and the inclined planes (1*i*) simultaneously extend in a direction parallel to the CPPs while maintaining their crystal structure, thereby suppressing the generation of incoherent interfaces.

As illustrated in FIG. 2(*b*), when the width of the seed plane (1*p*) is increased beyond the critical width (We) by further step-controlled epitaxy, precursors of SiC reaction are supersaturated in the center of the seed plane, and a two-dimensional nucleus (2*e*) of 3C-SiC is generated (nucleation process). Taking over the close-packed structure on the surface of the seed plane, the stacking sequence of CPPs in this two-dimensional nucleus (2*e*) is either ABC (CCP1) or ACB (CCP2). Accordingly, the two-dimensional nucleus (2*e*) of 3C-SiC does not contain a twin boundary. Thus, a high-performance semiconductor device with suppressed carrier leakage, scattering, or trapping can be obtained. However, the temperature and pressure need to be adjusted during epitaxial growth in consideration of the required area of the 3C-SiC layer since the critical width (We) depends on the diffusion distance and adsorption coefficient of the precursors of SiC reaction on the seed plane (1*p*).

When the hexagonal SiC surface is uniformly inclined in a specific direction with respect to a close-packed plane (CPP) of the crystal lattice, as in the conventional step-controlled epitaxy, the hexagonal SiC layer surface is covered with approximately parallel steps of molecular layer height and a flat terrace structure formed therebetween, and all the steps move parallel in a specific direction. In this case, the generation of a two-dimensional nucleus (2*e*) of 3C-SiC cannot be facilitated on the terraces as no particular terrace does not preferentially extend.

On the other hand, in the method of producing a SiC laminate according to the present invention, at least one end of the inclined plane (1*i*) is in contact with the seed plane (1*p*), and the inclined plane has a depression angle (θp) corresponding to the inclination angle (θ) with respect to the adjacent seed plane. For this reason, steps do not move on the seed plane when step-controlled epitaxy is performed, and a terrace originating from the seed plane (1*p*) extends parallel to the CPP, which increases the degree of supersaturation. Thereby, a two-dimensional nucleus (2*e*) of 3C-SiC is generated (nucleation process).

The method of producing a SiC laminate according to the present invention has an advantage in that a two-dimensional nucleus (2*e*) of 3C-SiC extends to form a new seed plane (2*p*) through the lateral epitaxy process (seed process), and after the new seed plane (2*p*) extends beyond the critical width (We), another two-dimensional nucleus (2*e*) of 3C-SiC is also generated thereon (nucleation process). In this manner, the seed process and nucleation process are alternately repeated along with the lateral epitaxy process. Specifically, as illustrated in FIG. 2(*b*), once a two-dimensional nucleus (2*e*) of 3C-SiC is formed (nucleation process), its edge corresponds to a new step and epitaxially grows in the lateral direction, and the area of the two-dimensional nucleus (2*e*) of 3C-SiC increases parallel to the CPP (seed process) as illustrated in FIG. 2(*c*). At this time, inclined planes adjacent to the seed plane also epitaxially grow in the lateral direction while exposing the stacking sequence of hexagonal SiC, and thus the structure of the coherent heterointerface (3) is maintained. When the two-dimensional nucleus of 3C-SiC has an area exceeding the critical width (We) as the lateral epitaxy process is further continued, its surface becomes a new seed plane (2*p*) as illustrated in FIG. 2(*d*), and another two-dimensional nucleus (2*e*) of 3C-SiC is generated thereon (nucleation process). As described above, a 3C-SiC layer (2) that does not contain a twin boundary can be formed on a hexagonal SiC layer (1) without limiting the thickness of the 3C-SiC layer (2).

FIG. 3 illustrates details of the cross-sectional structure of a SiC laminate formed by the SiC laminate production method according to an embodiment of the present invention. A hexagonal SiC layer (1) and a 3C-SiC layer (2) are stacked through a coherent heterointerface (3) that is exactly parallel to a CPP. The coherent heterointerface (3) is exposed at an inclination angle (θ) with respect to the plane on the main surface (S) and separates the hexagonal SiC surface (1S) and the 3C-SiC surface (2S). In addition, the layered structures of their respective CPPs are exposed on the hexagonal SiC surface (1S) and the 3C-SiC surface (2S) to allow step-controlled epitaxy. At the same time, part of the 3C-SiC layer (2) is exposed on the main surface as a seed plane (2*p*) parallel to the CPP, thereby continuously generating a new two-dimensional nucleus of 3C-SiC. The {−1-11} planes (2N) of the 3C-SiC layer are parallel to three-fold symmetry planes (1N) selected from the {0-33-n} planes of the hexagonal SiC layer (where n is a natural number indicating the stacking periodicity of the close-packed planes). Thus, it is possible to obtain a SiC laminate that does not contain any incoherent interfaces, twin boundaries (TBs), or double positioning boundaries.

For example, according to the SiC laminate production method as set forth in claim 4 of the present invention, as illustrated in the top view of FIG. 4(*a*) and the cross-sectional view of FIG. 4(*b*), a positively inclined plane (1*if*), which is inclined in a positive inclination direction (If) from a close-packed plane (CPP) of the crystal lattice, is formed so as to divide the surface of the hexagonal SiC layer. Further, a negatively inclined plane (1*ib*), which is inclined in a negative inclination direction (Ib) opposite to the positive inclination direction, is also formed so as to divide the surface of the hexagonal SiC layer. Hence, there is a ridge portion (1*r*) or a valley portion (1*v*) between the positively inclined plane (1*if*) and the negatively inclined plane (1*ib*), and their regions each necessarily include a portion parallel to the close-packed plane (CPP). Since each inclined plane adjacent to the ridge portion (1*r*) has a depression angle (θp), the layered structure of close-packed planes (CPPs) is exposed on the side surface. The seed plane (1*p*) extends as it grows laterally through step-controlled epitaxy.

On the other hand, the valley portion (1*v*) is located between the inclined planes (1*if*, 1*ib*) having an elevation angle, and therefore the portion parallel to the CPP does not extend, and it contracts as opposing steps meet each other, which inevitably prevents step-controlled epitaxy. As a result, the end position of the 3C-SiC surface (2S) can be identified by the arrangement of the inclined planes, and the 3C-SiC surface (2S) and the hexagonal SiC surface (1S) can be distinguished from each other.

According to the SiC laminate production method as set forth in claim 5 of the present invention, the ridge portion (1*r*) and the valley portion (1*v*) extend in a direction substantially perpendicular to the inclination directions (If, Ib). Therefore, the direction in which step-controlled epitaxy occurs is limited only to the inclination directions, which enables the production of SiC laminates with excellent reproducibility. In addition, the 3C-SiC surface (2S) and the hexagonal SiC surface (1S) are aligned in stripes on the main surface, which facilitates the arrangement of semiconductor devices.

The SiC laminate of the present invention is characterized in that a segment (3S) of the coherent heterointerface exposed on the main surface has no edge. Specifically, the segment (3S) of the coherent heterointerface traverses from one end to the other end of the main surface as illustrated in FIG. 5, or it has a polygonal (triangular) shape as illustrated in FIG. 6. Due to such arrangement of the segment of the coherent heterointerface, the 3C-SiC surface (2S) and the hexagonal SiC surface (1S) are separated while maintaining the continuity of the crystal lattice. Thus, it is possible to arrange a desired semiconductor device on a SiC surface with a predetermined crystal structure without carrier trapping or leakage.

To achieve the arrangement of the coherent heterointerface (3) as described above, as illustrated in the top view of FIG. 7, the negatively inclined plane (1ib) and the positively inclined plane (1if) need to be located so as to divide the hexagonal SiC surface. In the case where the ridge portion (1r) of a truncated cone as illustrated in FIG. 8 or a truncated triangular (polygonal) pyramid as illustrated in FIG. 9 is used as a seed plane, the ridge portion (1r) needs to have a depression angle ($\theta$p) of 0.5 degrees or more and less than 73 degrees with respect to all adjacent inclined planes (1is, 1iu, 1iv, 1iw).

On the other hand, when there is an inclined plane that does not completely divide the surface of the hexagonal SiC layer as with the partial inclined planes (1pf, 1pb) illustrated in FIG. 7, a discontinuous valley portion (1pv) and a discontinuous ridge portion (1pr) are also formed, and a segment (3J) of the incoherent interface is exposed at part of the boundary between the 3C-SiC surface (2S) and the hexagonal SiC surface (1S) as illustrated in FIG. 10. As a result, the properties of semiconductor devices degrade due to the trapping and scattering of carriers.

Incidentally, even with the method as set forth in claims 3 to 5 of the present invention, the close-packed structures of two-dimensional nuclei (2e) of 3C-SiC formed on different seed planes (1p) are not always identical. In other words, it is not uniquely defined whether CPPs of 3C-SiC two-dimensionally nucleated on seed planes have a stacking sequence of ABC (CCP1) or ACB (CCP2), and a twin boundary (TB) is formed when 3C-SiC surfaces grown from different seed planes coalesce, which may degrade the properties of semiconductor devices. Therefore, claim 6 includes a limitation that the thickness (te in FIG. 3) of a 3C-SiC layer formed on a seed plane (1p) is less than the product of the tangent of the inclination angle ($\theta$) and L, where L is the minimum length in the inclination direction of a plane obtained by projecting each of inclined planes (1i) onto a close-packed plane (CPP), thereby providing a method that prevents the coalescence of 3C-SiC surfaces epitaxially grown in the lateral direction from different seed planes.

Alternatively, even when 3C-SiC surfaces (2S) that epitaxially grow in the lateral direction from different seed planes (1p) coalesce, by minimizing the energy of the step edge of seed planes through the surface structure stabilization process according to the SiC laminate production method as set forth in claim 7, the close-packed structures of all the seed planes (1p) match. Thus, the formation of twin boundaries can be suppressed in the 3C-SiC layer.

By using the SiC laminate production method according to the present invention, the structure of the coherent heterointerface (3) between a hexagonal SiC layer (1) and a 3C-SiC layer (2) becomes uniform. This suppresses variation in the potential barrier along the coherent heterointerface, enhances the mobility of carriers transported parallel to the coherent heterointerface (3), and reduces the channel resistance of MOSFETs. For example, when a superlattice of layers of hexagonal SiC (1) and 3C-SiC (2) is formed by the SiC laminate production method of the present invention, the mobility of two-dimensional electron gas in the 3C-SiC layer, which serves as a quantum well, is not restricted. Therefore, high-speed semiconductor switching devices such as high electron mobility transistors (HEMTs) can be obtained.

Furthermore, the semiconductor device of the present invention uses as a substrate a SiC laminate in which a 3C-SiC surface (2S) and a hexagonal SiC surface (1S) separated by a segment (3S) of the coherent heterointerface are exposed on the main surface (S) as illustrated in FIG. 11. Accordingly, it is possible to form a device that requires an increase in the channel mobility of electrons such as an NMOSFET in a 3C-SiC layer (2) with a low interface state density for electrons and arrange a device that requires an increase in the channel mobility of holes such as a PMOSFET in a hexagonal SiC layer (1) with a low interface state density for holes. Thereby, complementary metal-oxide-semiconductor (CMOS) circuits that take advantage of the low-loss performance of SiC can be manufactured.

Furthermore, since the depth of the coherent heterointerface (3) depends on the inclination angle ($\theta$) and the thickness (te) of a two-dimensional nucleus of 3C-SiC deposited on the seed plane (1p), a SiC layered structure with any layer thickness can be obtained by adjusting the inclination angle ($\theta$) and the thickness (te) according to the required device structure. For example, when a 3C-SiC layer having a thickness of 0.1 μm near the surface is used to provide a low-resistance channel and a hexagonal SiC layer having a thickness of 20 μm below it is used as a drift layer to manufacture a MOSFET with desired on-resistance and breakdown voltage, the source electrode may be formed on the surface of the 3C-SiC layer 1.43 μm away from the segment (3S) of the coherent heterointerface with an inclination angle ($\theta$) of 4 degrees. In the case of an inclination angle ($\theta$) of 30 degrees, the source electrode may be formed on the surface of the 3C-SiC layer 0.2 μm away from the segment (3S) of the coherent heterointerface.

In order to arrange a freewheeling diode adjacent to the above MOSFET, a metal electrode with a high work function is provided as an anode (An) on the hexagonal SiC surface (1S) as illustrated in FIG. 11. Hexagonal SiC has a lower electron affinity than 3C-SiC, which increases the Schottky barrier height, making it possible to obtain a Schottky barrier diode (SBD) with high withstand voltage and low loss. Thus, it is possible to produce a semiconductor device in which both steady-state loss and switching loss are suppressed. In addition, since the breakdown voltage and on-resistance of the SBD are determined by the band gap of SiC, a hexagonal SiC layer having a desired band gap can be selected from the polytypes of SiC according to the desired semiconductor device characteristics.

BRIEF DESCRIPTION OF THE DRAWINGS

FIG. 3 is a diagram illustrating details of a cross-sectional structure formed by a SiC laminate production method according to an embodiment of the present invention.

FIGS. 4(a) and 4(b) are top and cross-sectional views, respectively, illustrating a SiC laminate production method of the present invention as set forth in claim 4.

MODES FOR CARRYING OUT THE INVENTION

In the following, some embodiments and features of a SiC structure, a method of producing the same, and a semiconductor device of the present disclosure will be described.

SiC Laminate Production Method According to First Embodiment

In the implementation of a method of producing a SiC laminate according to a first embodiment of the present invention, a single-crystal hexagonal SiC wafer is prepared as a substrate. As to single-crystal SiC wafers, 4H-SiC or 6H-SiC wafers are commercially available. In this embodiment, a 4H-SiC wafer with a band gap ($E_g$) of 3.2 eV, which is suitable for manufacturing high-voltage power semiconductor devices, is used. In carrying out the method, there is no restriction on the resistivity of the 4H-SiC wafer. Nevertheless, when the SiC laminate is used as a substrate of a power MOSFET, it is desirable to use a wafer doped with donor impurities (nitrogen, phosphorus, etc.) at a high concentration and exhibiting a resistivity of 20 mΩ·cm or less to reduce the specific on-resistance ($R_{on}$). It is also desirable that the surface of the 4H-SiC wafer be substantially parallel to the (0001) plane having Si polarity. However, if microfabrication is difficult in the off process or the seed process, for the reasons described later, it is desirable to use a SiC wafer (vicinal SiC wafer) the surface of which is inclined in a specific direction selected from the <11-20> or <1-100> directions at an angle in the range of 0.5 to 8 degrees with respect to a close-packed plane.

(Off Process, Seed Process)

This embodiment describes a method of producing a SiC laminate having a main surface in which a lattice-matched (coherent) heterointerface linearly traverses a 4H-SiC wafer from one end to the other, and 3C-SiC and 4H-SiC surfaces alternate in stripes. In order to form this structure, as illustrated in the cross-sectional view of FIG. 12(b), a plurality of trenches (TR) each having a positively inclined plane (1if) and a negatively inclined plane (1ib) as sidewalls are arranged in parallel across the surface of the 4H-SiC wafer.

Figure 12A:
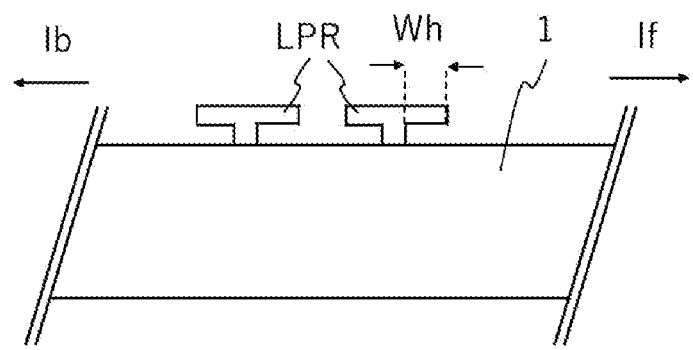
FIGS. 12(a) and 12(b) are cross-sectional views illustrating a SiC laminate production method according to a first embodiment of the present invention.
Figure 12B:
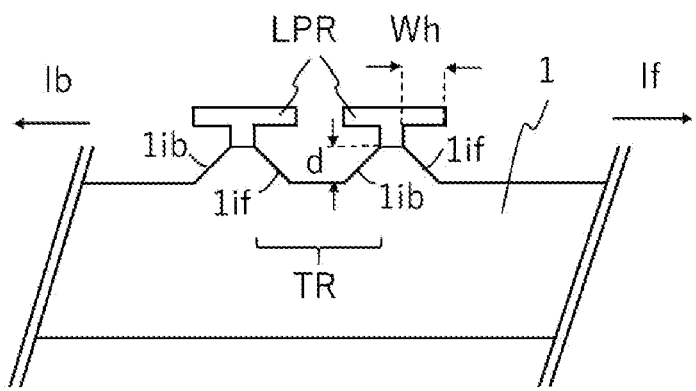

Such methods as machining, chemical etching, and laser processing can be used to form the trenches (TR); however, considering the reproducibility of the shape of the inclined planes and the degree of freedom of arrangement, a processing method that uses photolithography and dry etching is most desirable and simple. In this process, first, as illustrated in FIG. 12(a), a plurality of linear photoresist (LPR) patterns are formed on the surface of the 4H-SiC wafer. The cross-section of each LPR pattern is T-shaped with a flange having a width of Wh as it is necessary to form an inclined plane in a dry etching process (described later). A method for forming a T-shaped LPR pattern is described in Patent Document 9 (JP 2000-214593 A) and the like, and therefore a detailed description thereof is omitted herein. However, it is to be noted that the thickness of the photoresist is 0.5 μm or more and 5 μm or less, more preferably 0.7 μm or more and 2 μm or less. If the thickness of the photoresist is less than 0.5 μm, a portion that is to be a seed plane is partially etched in the dry etching process (described later) and loses its smoothness, which may result in multinucleation of 3C-SiC. When multinucleation occurs, a twin boundary (TB) is formed in a 3C-SiC layer. On the other hand, if the thickness of the photoresist is more than 5 μm, the accuracy of the line width and flange shape of the LPR patterns decreases. As a result, the boundary between a 3C-SiC surface and a 4H-SiC surface formed by a lateral epitaxy process (described later) meanders, generating an incoherent interface.

To achieve the effects of the present invention, the LPR patterns need to be linearly continuous from one end to the other end of the wafer surface. In addition, the direction in which the LPR patterns extend (division direction), the spacing between adjacent LPR patterns (space width), and the minimum line width of the LPR patterns (line width) are important factors for achieving the effects of the present invention. Considering that a plane inclined in the [11-20] direction is used in general step-controlled epitaxy, it is desirable that the division direction be within 2 degrees with respect to the [1-100] direction, which is perpendicular to the [11-20] direction, and within 0.5 degrees for the best result. This is because the more the orthogonality of the division direction with respect to the inclination direction is compromised, the more discontinuities occur in the coherent heterointerface. Accordingly, all LPR patterns are positioned and processed so as to be parallel to the [1-100] direction. A second orientation flat formed on the periphery of a commercially available wafer can be used as a reference for positioning the LPR patterns.

The line width is desirably 100 nm or less, more desirably 1 nm or less. If the line width is more than 100 nm, the width of a seed plane (1p) increases, which may cause multinucleation of two-dimensional nuclei (2e) of 3C-SiC due to the high degree of supersaturation, and a 3C-SiC layer (2) may contain a twin boundary (TB).

Meanwhile, the space width is desirably 1 μm or more and 1 mm or less, and 10 μm or more and 500 μm or less for the best result. The reasons for this are as follows: A trench (TR) is formed at a location corresponding to the space width by dry etching (described later), and the side walls of the trench (TR) correspond to inclined planes (1if, 1ib). If the space width is less than 1 μm, it is difficult to provide a sufficient height difference (d) and depression angle (θp) to the inclined planes formed by dry etching (described later), resulting in incomplete step-controlled epitaxy. On the other hand, when the space width is more than 1 mm, the area ratio of a 3C-SiC surface (2S) obtained by this method decreases relative to the area of the main surface (S), and the current capacity per unit area of a semiconductor device decreases.

After forming the LPR patterns as described above, dry reactive ion etching (RIE) is performed to etch SiC exposed at a location corresponding to the space width, thereby forming a trench (TR). With this, a positively inclined plane (1if) and a negatively inclined plane (1ib) can be obtained as the sidewalls of the trench (TR). It is desirable to use an etching gas that contains fluorine such as $SF_6$, $NF_3$, $BF_3$, and $CF_4$ to etch SiC by the RIE process. In particular, if $CF_4$ is used as the dry etching gas and mixed with $O_2$ such that the flow rate of $O_2$ is a quarter of that of $CF_4$, the etching rate of SiC can be maximized. It is desirable to use a parallel-plate radio frequency (RF) etching system in carrying out the RIE process. In addition, the power input to the RF etching system is preferably 200 W or less, more desirably in the range of 75 W to 150 W, and the gas pressure is preferably 13.8 Pa or more, more desirably in the range of 30 Pa to 50 Pa. If the input power exceeds 200 W, plasma irradiation induces crystal defects on the surface of SiC crystal, which may result in incomplete step-controlled epitaxy in the lateral epitaxy process (described later). Meanwhile, if the input power is less than 75 W, the straight motion of ions is impaired, making it difficult to adjust the depression angle (θp) of the inclined planes. Similarly, if the gas pressure is below 13.8 Pa, the kinetic energy of the ions that form a plasma increases, and crystal defects are more likely to occur on the surface of SiC crystal. If the gas pressure is above 50 Pa, residues from etching may adhere to part of the inclined planes, which may also result in incomplete step-controlled epitaxy in the lateral epitaxy process (described later).

The SiC surface exposed at an opening between adjacent LPR patterns is etched and removed by the above RIE process to a predetermined depth of 1 nm or more and 10 μm or less. When the etching depth is less than 1 nm, the step density exposed on the inclined planes (1if, 1ib) becomes very small, resulting in incomplete step-controlled epitaxy in the lateral epitaxy process (described later). On the other hand, when the etching depth exceeds 10 μm, the LPR patterns are lost during the dry etching. This not only impairs the controllability of the depression angle (θp) but also decreases the smoothness of the seed plane (1p), and a twin boundary (TB) is formed in the 3C-SiC layer.

In the RIE process of this embodiment, the etching depth changes around under the flange of each LPR pattern. Therefore, the depression angle (θp) of the inclined planes (1if, 1ib) can be controlled by the width (Wh) of the flange of the LPR pattern and the depth of the trench (TR) (i.e., the height difference (d) of the inclined planes). Specifically, since the height difference (d) corresponds to the product of the width (Wh) and the tangent of the depression angle (θp), if the height difference (d) is adjusted in the range of 0.009 to 3.27 times the width (Wh) by changing the time of the RIE process, a depression angle (θp) of 0.5 to 73 degrees can be obtained. For example, by adjusting the time of the RIE process so that the width (Wh) is 0.5 μm and the height difference (d) is 35 nm, a depression angle (θp) of 4 degrees can be obtained. Furthermore, since different values can be selected for the width (Wh) in the positive inclination direction (If) and the negative inclination direction (Ib), the depression angle of the positively inclined plane and the depression angle of the negatively inclined plane can be arbitrarily changed. Note, however, that the depression angle (θp) of less than 0.5 degrees is not desirable because the step density exposed on the inclined planes becomes extremely low, and an increase in the degree of supersaturation causes multinucleation of 3C-SiC. Meanwhile, when the depression angle (θp) is 73 degrees or more, the substantial step interval becomes one molecule or less in size, and step-controlled epitaxy does not occur. Therefore, the depression angle (θp) is desirably within the range of 1 to 15 degrees. It is more desirable that the depression angle (θp) be in the range of 2 to 8 degrees to achieve epitaxial growth with excellent reproducibility. Incidentally, since the depression angle (θp) corresponds to the inclination angle (θ) where the coherent heterointerface and the main surface intersect, the optimum range of the inclination angle (θ) is determined by the depression angle (θp).

After the desired shape of the inclined planes is obtained as described above, any residual photoresist on the surface of the 4H-SiC wafer is removed using an oxygen ashing system. The photoresist can be completely removed by treatment at 100 W for 15 minutes or more. In addition, sulfuric acid-hydrogen peroxide mixture (SPM) cleaning and rinsing with pure water are each performed for 5 minutes to completely remove metal impurities, dust, and the like from the surface of the 4H-SiC wafer. If this cleaning is insufficient, dust and impurities cause incomplete step-controlled epitaxy in the lateral epitaxy process, which increases the defect density in epitaxial films and decreases the smoothness of the coherent heterointerface.

Figure 13:
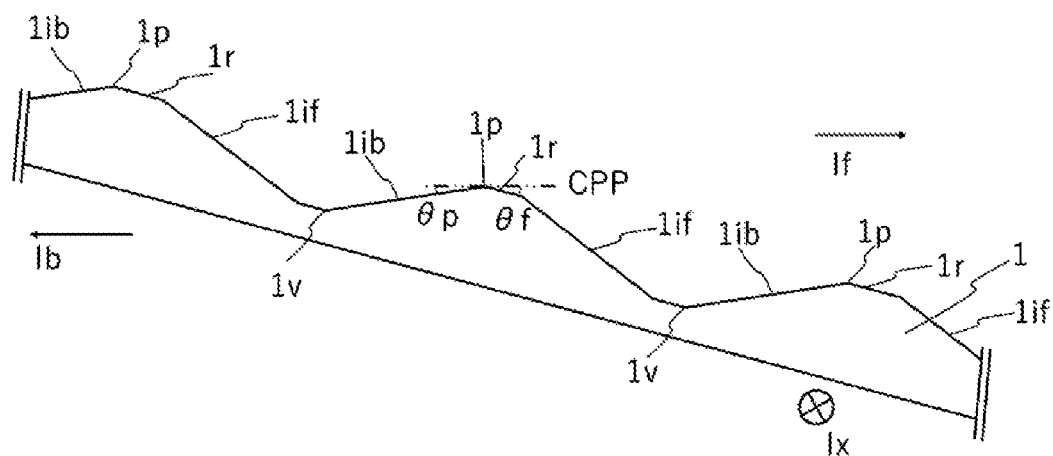
FIG. 13 is a cross-sectional view illustrating a method for forming a seed plane using a vicinal wafer in the SiC laminate production method according to the first embodiment of the present invention.

The off process and the seed process have been described in detail above. If it is difficult to achieve a line width of 100 nm or less, by using a vicinal wafer having a surface inclined from a CPP at an initial inclination angle (θf) of 0.5 to 8 degrees in the [11-20] direction, i.e., a specific direction of the inclined surface, a seed plane with a width of substantially less than 1 nm can be obtained. For example, the cross-sectional view of FIG. 13 illustrates that a substantial seed plane is confined to the upper end of the negatively inclined plane (1ib) (where the CPP corresponds to the tangent line) as the wafer surface is inclined from the CPP in the positive inclination direction (If), and the ridge portion (1r) also functions as part of the positively inclined plane (1if). Additionally, the widths of terraces adjacent to both ends of the seed plane (1P) are asymmetrical, and the stabilization of the wider terrace is prioritized in a surface structure stabilization process (described later). As a result, the close-packed structure of the 3C-SiC surface (2S) is uniquely defined as either CCP1 or CCP2. Note that the depression angle of the inclined plane with respect to the ridge portion (1r) obtained in the above process needs to be 0.5 degrees or more than the initial inclination angle (θf) to obtain an effective negatively inclined plane (1ib). This is because otherwise the inclined plane would have a depression angle (θp) of less than 0.5 degrees or negative degrees with respect to the seed plane (1P).

(Surface Structure Stabilization Process)

Prior to the lateral epitaxy process (described later), it is desirable to stabilize the surface energy of the seed plane (1P) by a surface stabilization process as set forth in claim 7 of the present invention to uniformize the close-packed structure. Described below are treatment conditions for the surface structure stabilization process. The 4H-SiC wafer that has undergone the off process is placed in a hydrogen treatment vessel and exposed to a hydrogen gas atmosphere of 700 hPa to 1100 hPa. At this time, the purity of hydrogen gas is desirably 99.99% or higher, more desirably 99.9999% or higher. If the purity of hydrogen is less than 99.99%, residual oxygen and water vapor components oxidize and etch the surface of the 4H-SiC wafer, making step-controlled epitaxy difficult.

Next, the temperature in the hydrogen treatment vessel is raised from 300° C. to 600° C. and maintained for 1 hour or more. The longer the temperature is maintained, the more the stabilization of the surface structure is ensured; however, the lower the productivity. In order to achieve both the productivity improvement and stabilization of the surface structure of the seed plane, the substrate temperature is desirably at 450° C. to 550° C., and the hydrogen pressure is desirably at 900 hPa to 1000 hPa. If the treatment temperature is above 550° C., or if the hydrogen pressure is less than 900 hPa, the SiC surface is etched with hydrogen and its smoothness is decreased. Meanwhile, if the hydrogen pressure is higher than 1000 hPa, the inside of the treatment vessel has a positive pressure with respect to the atmosphere, which is undesirable from a safety standpoint because of the risk of hydrogen gas leakage.

(Nucleation Process, Lateral Epitaxy Process)

After the off process or the surface structure stabilization process described above, step-controlled epitaxy is performed as the lateral epitaxy process. The lateral epitaxy process of this embodiment may employ a commercially available SiC epitaxial growth apparatus, and a combination of hydrocarbon gas and any one or more of silane-based gas, silane chloride-based gas, and organosilane-based gas can be used as the source gas. In general SiC epitaxial growth, a mixed gas of monosilane and propane, a mixed gas of dichlorosilane and acetylene, or a mixed gas of silicon tetrachloride and methane is used. In particular, when the embodiment is implemented by using a mixed gas of monosilane and propane, step-controlled epitaxy with excellent reproducibility is achieved.

In this embodiment, epitaxial growth of SiC is performed as follows: the 4H-SiC wafer is placed on a graphite susceptor coated with SiC, which is then placed in a quartz reaction vessel, and the wafer is heated to a predetermined temperature by induction heating of the susceptor from outside the reaction vessel. The wafer is maintained at a constant temperature in the range of 1400° C. to 1700° C. during epitaxial growth, and thereby SiC single crystal is epitaxially grown. A wafer temperature of 1500° C. to 1650° C. is particularly desirable to obtain a high-quality single-crystal SiC layer. It is more desirable to maintain the wafer at a constant temperature of 1550° C. to 1650° C. to achieve step-controlled epitaxy realizing both the extension of a seed plane and two-dimensional nucleation of 3C-SiC on the surface of the seed plane.

In the epitaxial growth, steps move at a growth rate of 171 μm/hour in both the positive inclination direction (If) and the negative inclination direction (Ib) by, for example, setting the temperature of the wafer to 1650° C., the flow rate of hydrogen to 5 slm, the flow rate of monosilane to 50 sccm, the flow rate of propane to 13 sccm, and the pressure in the reaction vessel to 300 hPa. As a result, when the depression angle (θp) is 4 degrees, epitaxial growth proceeds at a growth rate of 12 μm/hour in the [0001] direction.

For adjusting the resistivity of the epitaxially grown layer, if one or more gases selected from $N_2$, $PH_3$, $B_2H_5$, trimethylaluminum (TMA), and $AlCl_3$ are mixed in the source gases in an arbitrary amount in the epitaxial growth process, the epitaxial layer of SiC can be doped with donor impurities (N, P) or acceptor impurities (B, Al). For example, in the case of forming a drift layer of a MOSFET with a breakdown voltage ($V_b$) of 600 V, 5 sccm of $N_2$ is mixed in the source gases and epitaxial growth is performed for 50 minutes. With this, it is possible to obtain an epitaxially grown layer of 10 μm thick with a donor concentration of $3 \times 10^{15}$ $cm^{-3}$ at room temperature. When the depression angle (θp) is 4 degrees, the 3C-SiC surface formed by this epitaxial growth has a width of 143 μm in the [11-20] direction.

(Structure of SiC Laminate)

Through the epitaxial growth process described above, it is possible to obtain a SiC laminate in which a coherent heterointerface of 4H-SiC and 3C-SiC is formed parallel to a close-packed plane (CPP). On the main surface of the SiC laminate, a segment of the coherent heterointerface is exposed as a straight line parallel to the [1-100] direction, and the 4H-SiC surface and the 3C-SiC surface are clearly demarcated. Furthermore, since the [1-10] direction of 3C-SiC coincides with the [1-100] direction of 4H-SiC, and their CPPs are parallel to one another, all {1-11} planes of 3C-SiC are perfectly matched to a combination of three-fold symmetry planes selected from the {0-33-4} planes of 4H-SiC. Thus, it is possible to produce a SiC laminate that does not contain a twin boundary with no scattering and trapping at the heterointerface.

SiC Laminate Production Method According to Second Embodiment

In the implementation of a method of producing a SiC laminate according to a second embodiment of the present invention, a single-crystal hexagonal SiC wafer is prepared as a substrate. As to single-crystal SiC wafers, 4H-SiC or 6H-SiC wafers are commercially available. In this embodiment, a 4H-SiC wafer with a band gap ($E_g$) of 3.2 eV, which is suitable for manufacturing high-voltage power semiconductor devices, is used. In carrying out the method, there is no restriction on the resistivity of the wafer. Nevertheless, when the SiC laminate is used as a substrate of a power MOSFET, it is desirable to use a wafer doped with donor impurities at a high concentration so that the resistivity is 20 mΩ·cm or less. It is also desirable that the surface of the 4H-SiC wafer be substantially parallel to the (0001) plane having Si polarity. However, if microfabrication is difficult in the off process or the seed process, it is desirable to use a SiC wafer (vicinal SiC wafer) the surface of which is inclined in a specific direction selected from the <11-20> or <1-100> directions at an angle in the range of 0.5 to 8 degrees with respect to a CPP.

(Off Process, Seed Process)

This embodiment describes a method of producing a SiC laminate in which the periphery of a 3C-SiC surface on the main surface is surrounded by a 4H-SiC surface via a coherent heterointerface. For this purpose, rotationally symmetric inclined planes are formed on the surface of a 4H-SiC wafer. In forming the inclined planes, first, a Si oxide film (OX) is formed on the surface of the 4H-SiC wafer. Thermal oxidation in oxygen and steam, chemical vapor deposition (CVD) using silane and oxygen as precursor gasses, and sputtering can be used to form the Si oxide film. In this embodiment, the Si oxide film (OX) is used as a protective film for forming an inclined plane, and therefore it is important that the film has a uniform film thickness distribution and a high density. Accordingly, it is most desirable to form the Si oxide film (OX) by thermal oxidation in an oxygen atmosphere containing water vapor. It is also desirable that the Si oxide film (OX) be formed to have a thickness of 1 μm or more. If the thickness of the Si oxide film is less than 1 μm, the Si oxide film (OX) is lost during a polishing process (described later), making it difficult to obtain a desired inclined plane. However, SiC has a lower oxidation rate than Si, and the thermal oxidation process takes longer as the thickness of the Si oxide film (OX) increases. In the case of forming a Si oxide film (OX) with a thickness exceeding 1 μm on a 4H-SiC wafer by thermal oxidation in a relatively short time, a Si layer with a thickness of 0.4 μm or more is deposited on the 4H-SiC wafer prior to the thermal oxidation. By this way, a Si oxide film (OX) that is about 2.5 times or more thicker than the deposited Si layer can be obtained within 3 hours.

Figure 14A:
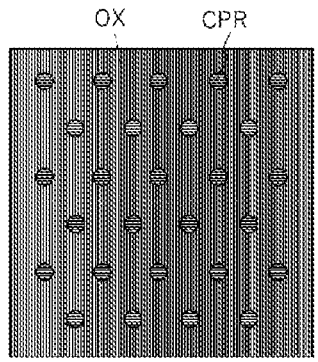
FIGS. 14(a) to 14(e) are top views illustrating a SiC laminate production method according to a second embodiment of the present invention.

Next, as illustrated in FIG. 14(a), a photoresist is applied to the 4H-SiC wafer coated with the Si oxide film (OX), and a plurality of circular photoresist (CPR) patterns are formed at regular intervals by using photolithography. The photolithography is performed in the same manner as in a general Si integrated circuit manufacturing process, and therefore a detailed description thereof is omitted herein. Note, however, that the CPR patterns desirably have a diameter of 100 nm or less. This is because the diameter of each CPR pattern corresponds to the width of a seed plane (1p) formed in the subsequent process, and if it exceeds 100 nm, the frequency of two-dimensional nucleation increases on the seed plane (1p). As a result, a 3C-SiC layer is more likely to contain a twin boundary (TB) due to multinucleation.

In the SiC laminate of this embodiment, the minimum spacing (space width) between adjacent CPR patterns is important to determine the area ratio of the surface of a 3C-SiC layer and the surface of a 4H-SiC layer. In order to obtain a practical SiC laminate surface, the space width is desirably in the range of 100 nm to 1 mm. A sufficient 4H-SiC surface area cannot be secured if the spacing between CPR patterns is less than 100 nm because, in this embodiment, the space width corresponds to twice the length of an inclined plane formed in the subsequent process. On the other hand, if the spacing between CPR patterns is more than 1 mm, it becomes difficult to provide the inclined plane with a sufficient height difference relative to its length, making it difficult to ensure a depression angle (θp) of 0.5 degrees or more for the inclined plane.

Figure 14D:
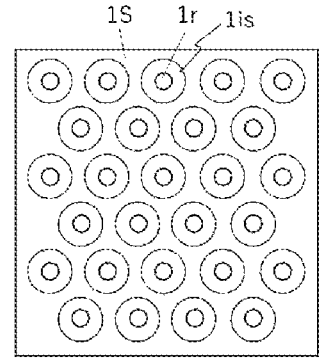
Figure 14B:
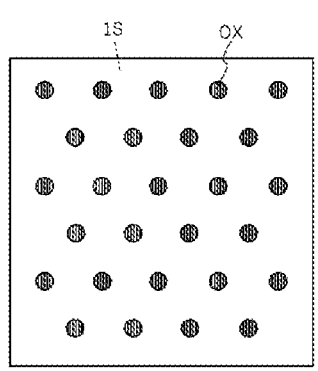

After forming the CPR patterns, the 4H-SiC wafer is immersed in a hydrofluoric acid (HF) solution with a concentration of 5% for 10 minutes to transfer the shape of the CPR patterns to the Si oxide film (OX). Then, the CPR patterns are removed using an oxygen ashing system as in the first embodiment of the SiC laminate production method to obtain a 4H-SiC surface partially covered with a circular oxide film as illustrated in FIG. 14(b).

Next, the surface of the 4H-SiC wafer is brought into contact with a polishing cloth impregnated with a diamond slurry having a pH of 5.5 or less to apply mechanical polishing thereto. The diamond slurry is continuously supplied to the polishing cloth at a flow rate of 400 cc or more per minute during the polishing. Preferably, the polishing cloth is attached to a flat turntable and the turntable is rotated at 30 rpm or higher. In addition, the pressure applied to the 4H-SiC wafer is adjusted so that the polishing rate is in the range of 0.2 μm/hour to 10 μm/hour. If the polishing rate exceeds 10 μm/hour, the surface smoothness of the inclined plane obtained by polishing is impaired. Meanwhile, if the polishing rate is less than 0.2 μm/hour, the machining of the inclined plane takes time, and sufficient productivity cannot be achieved.

With the above polishing treatment, a dent is formed where the 4H-SiC surface is not covered with the Si oxide film (OX), and an inclined plane (1is) is obtained on the side surface of the dent. As a result, as illustrated in the plan view of FIG. 14(c), a truncated cone is formed with a portion covered with the Si oxide film (OX) as a ridge portion (1r). The depression angle (θp) of the inclined plane (1is) with respect to the ridge portion (1r) of the truncated cone is determined by the height difference (d) of the inclined plane and the spacing between adjacent CPR patterns. Therefore, a depression angle (θp) of 0.5 to 73 degrees can be achieved by precisely controlling the polishing time. Note that a depression angle (θp) of less than 0.5 degrees is not desirable because the step density exposed on the inclined plane becomes extremely low, and an increase in the degree of supersaturation causes multinucleation of 3C-SiC. Meanwhile, when the depression angle (θp) is more than 73 degrees, the substantial step interval becomes one molecule or less in size, and step-controlled epitaxy does not occur. The depression angle (θp) is desirably within the range of 1 to 15 degrees. It is further desirable that the depression angle (θp) be in the range of 2 to 8 degrees to achieve epitaxial growth with excellent reproducibility. Incidentally, since the depression angle (θp) corresponds to the inclination angle (θ) where the coherent heterointerface and the main surface intersect, the optimum range of the inclination angle (θ) is determined by the depression angle (θp).

Figure 1:
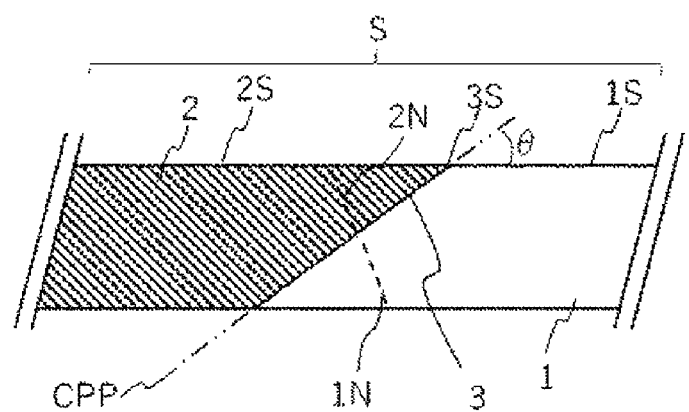
FIG. 1 is a cross-sectional view illustrating the structure of a SiC laminate according to an embodiment of the present invention.
Figure 2A:
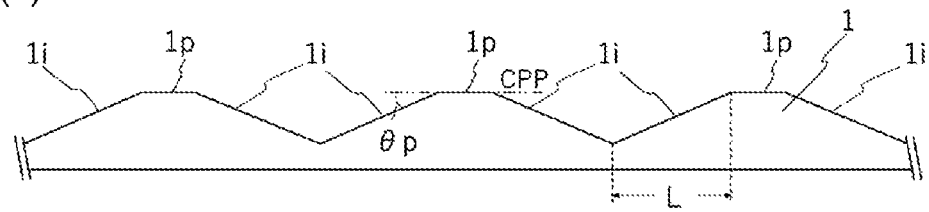
FIGS. 2(a) to 2(d) are cross-sectional views illustrating the process of a SiC laminate production method according to an embodiment of the present invention.
Figure 2B:
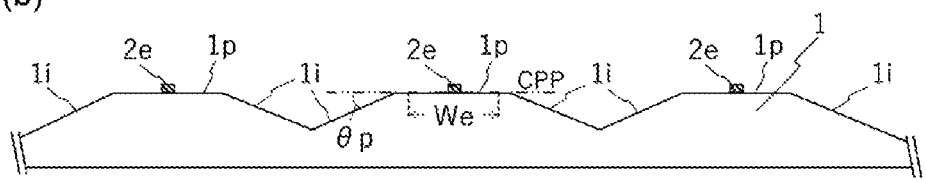
Figure 2C:
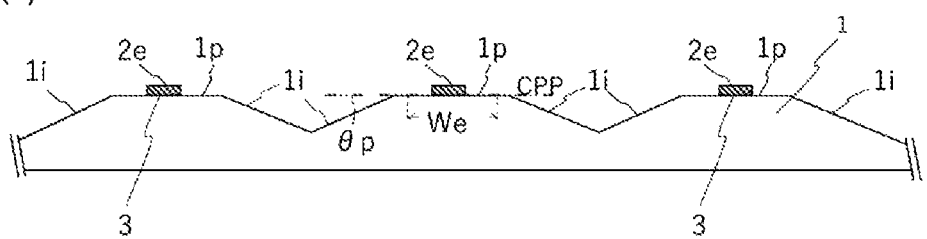
Figure 2D:
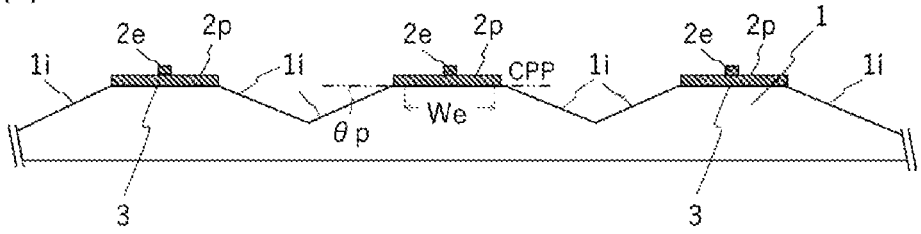
Figure 5:
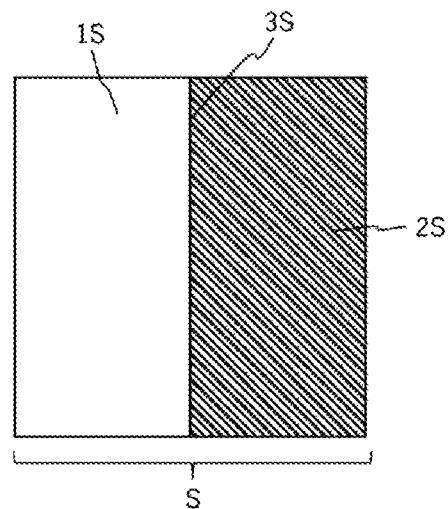
FIG. 5 is a top view illustrating the shape of a linear coherent heterointerface exposed on the main surface of a SiC laminate of the present invention.
Figure 6:
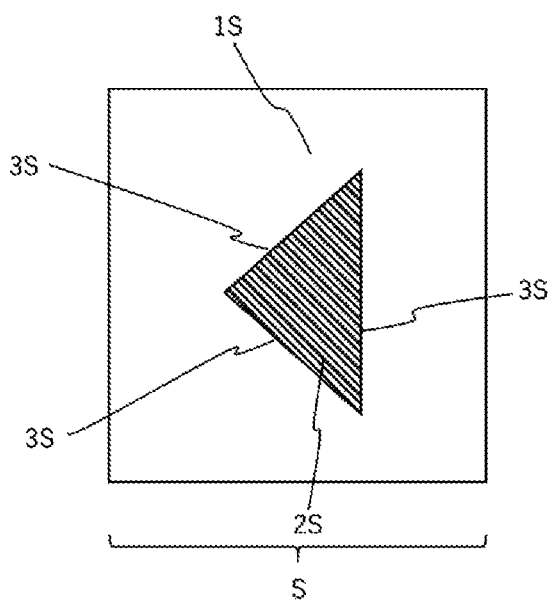
FIG. 6 is a top view illustrating the polygonal (triangular) shape of a coherent heterointerface exposed on the main surface of a SiC laminate of the present invention.
Figure 7:
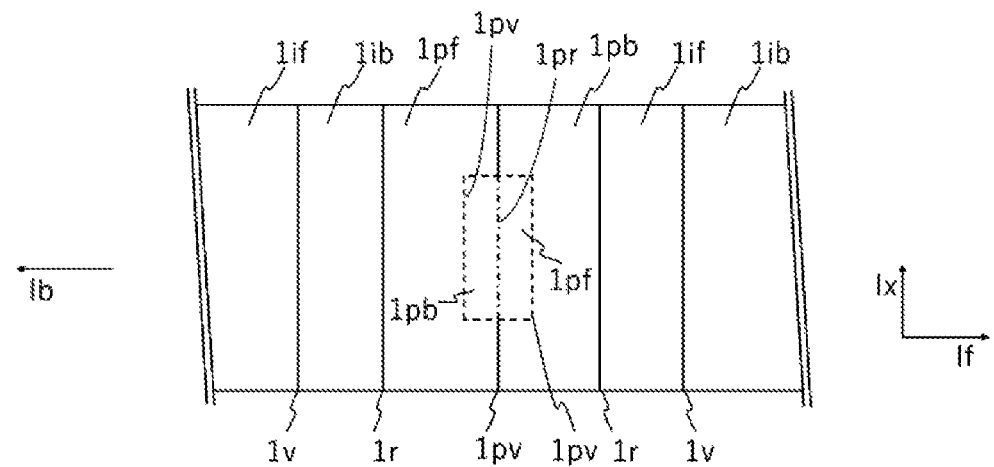
FIG. 7 is a top view of an inclined plane for explaining a SiC laminate production method according to an embodiment of the present invention.
Figure 8:
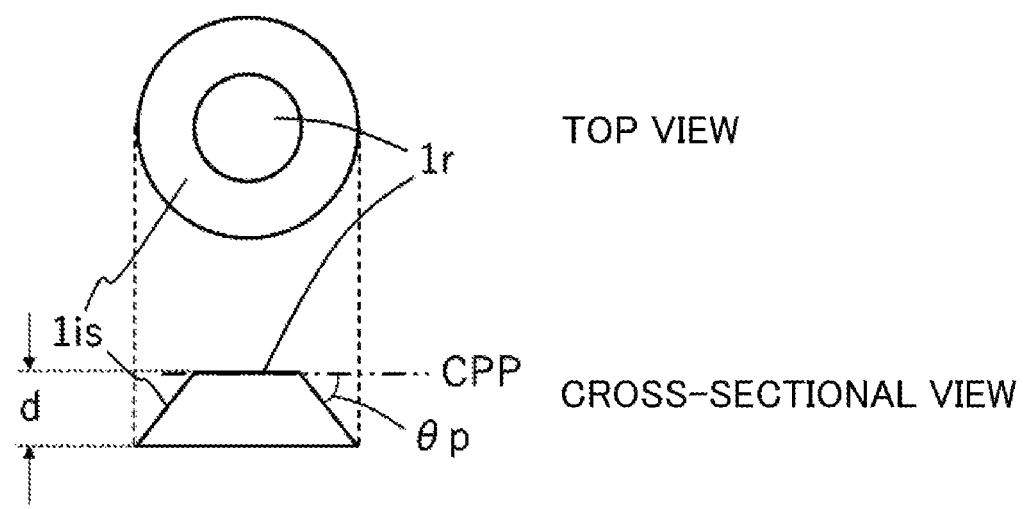
FIG. 8 illustrates top and cross-sectional views of a circular truncated cone related to a SiC laminate production method according to an embodiment of the present invention.
Figure 9:
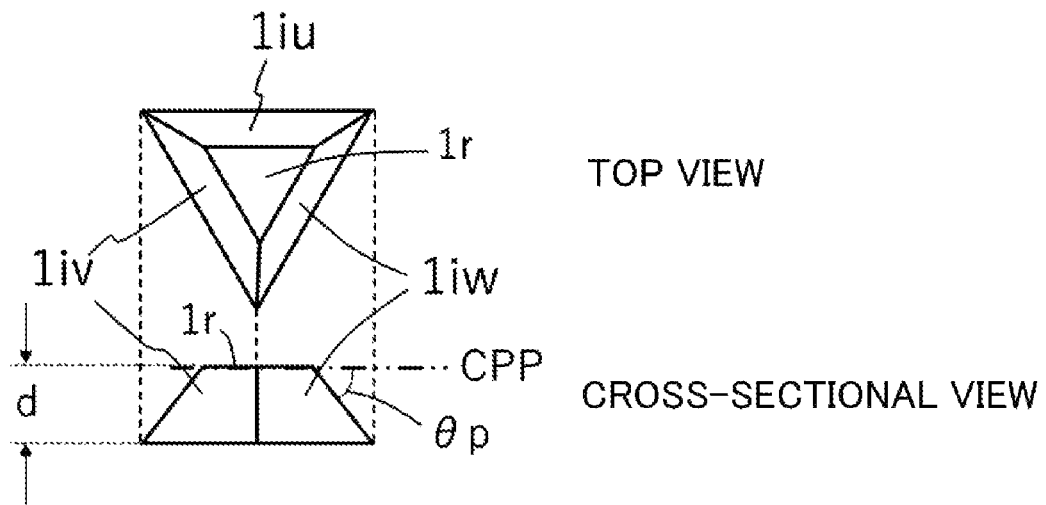
FIG. 9 illustrates top and cross-sectional views of a truncated polygonal (triangular) pyramid related to a SiC laminate production method according to an embodiment of the present invention.
Figure 10:
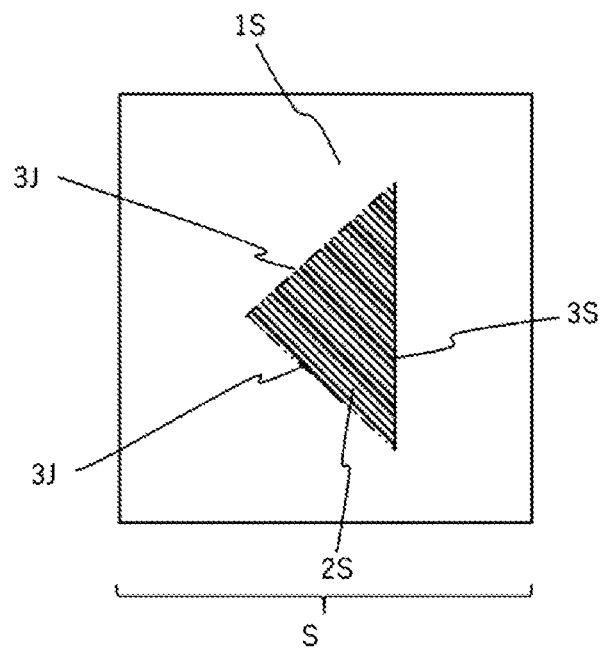
FIG. 10 is a top view of a SiC laminate with an exposed segment of an incoherent interface.
Figure 11:
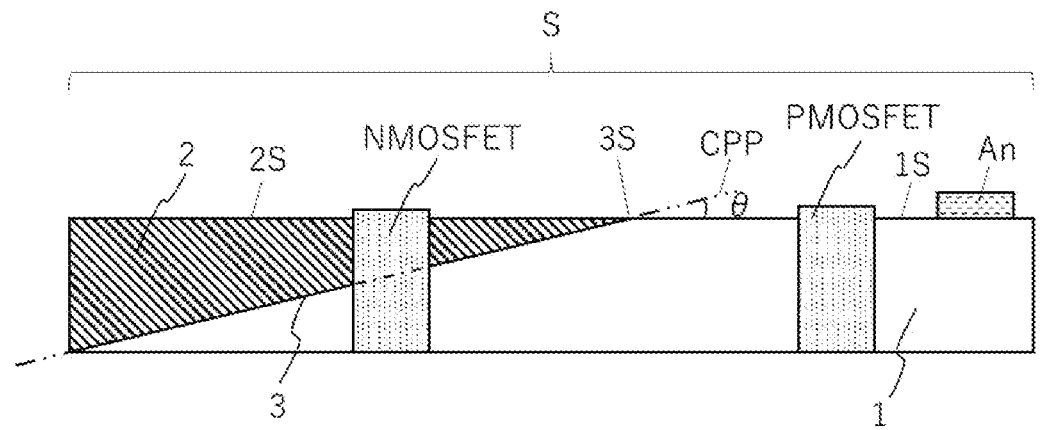
FIG. 11 is a cross-sectional view illustrating the structure of a semiconductor device according to an embodiment of the present invention.

After the truncated cone is obtained in a desired shape, the 4H-SiC wafer is immersed in an HF solution with a concentration of 5% for 10 minutes to remove the Si oxide film (OX) on the top of the truncated cone. This provides a truncated cone-shaped 4H-SiC surface as illustrated in the plan view of FIG. 14(d) or FIG. 8. Subsequently, SPM cleaning and rinsing with pure water are performed for 5 minutes or longer to remove dust and impurities from the surface. If this treatment is insufficient, it may cause incomplete step-controlled epitaxy (described later), resulting in the formation of a twin boundary (TB) in the 3C-SiC layer and an incoherent heterointerface.

The details of the off process and the seed process have been described above. If it is difficult to obtain a ridge portion (1r) with a diameter of 100 nm or less, a seed plane (1P) with a width of substantially 1 nm or less can be obtained by using a vicinal wafer. The range of the initial inclination angle (θf) of the vicinal wafer and the reason for it have already been described above in the first embodiment of the SiC laminate production method. A substantial seed plane is confined to the end of the ridge portion (1r) (where the CPP corresponds to the tangent line) as the wafer surface is inclined in a specific direction, and the ridge portion (1r)

functions as part of the inclined plane. In addition, the widths of terraces adjacent to both ends of the seed plane are asymmetrical, and the stabilization of the wider terrace is prioritized, promoting the effects of the surface structure stabilization process described below. Consequently, the close-packed structure of the surface of the 3C-SiC layer is uniquely defined as either CCP1 or CCP2. As a result, according to the embodiment, the 3C-SiC surface (2S) exposed on the main surface has a uniform shape.

(Surface Structure Stabilization Process)

After the off process described above, the surface structure stabilization process is performed in the same manner as in the first embodiment of the SiC laminate production method. This minimizes the surface energy of the seed plane (1p), and thereby the CCP structure can be uniquely defined.

(Nucleation Process, Lateral Epitaxy Process)

After the off process or the surface structure stabilization process described above, epitaxial growth is carried out as in the first embodiment of the SiC laminate production method. In the course of the epitaxial growth, the ridge portion (1r) epitaxially grows in the lateral direction, which extends the seed plane (1p). This extension of the seed plane increases the degree of supersaturation in the center of the seed plane, generating a two-dimensional nucleus (2e) of 3C-SiC. The generated two-dimensional nucleus (2e) of 3C-SiC forms a specific CCP structure reflecting the close-packed structure of the surface of the seed plane. The two-dimensional nucleus of 3C-SiC further grows laterally to form a new seed plane (2P), which extends the coherent heterointerface (3) and suppresses the formation of a twin boundary (TB) in the 3C-SiC layer (2).

(Structure of SiC Laminate)

Figure 14E:
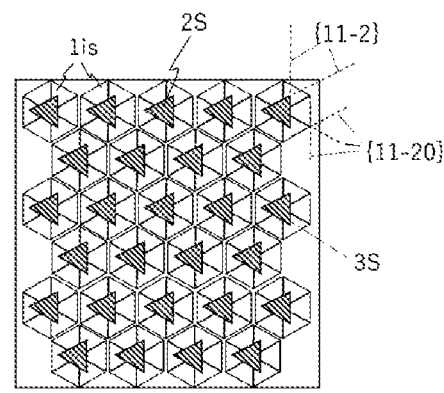
Figure 14C:
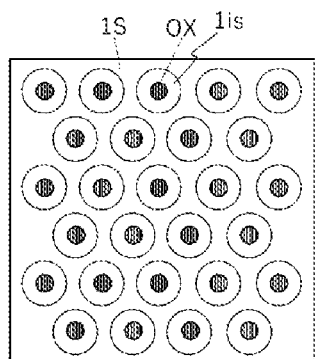

The CCP structure of 3C-SiC mononucleated on the seed plane has side surfaces including $\{110\}$, $\{11\text{-}2\}$ and $\{\text{-}1\text{-}12\}$ planes. Under the epitaxial growth conditions of this embodiment, the epitaxial growth rate of 3C-SiC is higher in the <110> directions than in other crystal orientations. Therefore, as illustrated in FIG. 14(e), the surface of the seed plane made of 3C-SiC has a triangular shape with sides parallel to the $\{11\text{-}2\}$ planes. A layered structure of 4H-SiC is exposed on the inclined plane (1is) around the 3C-SiC surface (2S). Under the epitaxial growth conditions of the embodiment, the epitaxial growth rate of 4H-SiC is maximum in the <110> directions compared to other crystalline plane orientations of 4H-SiC. Accordingly, the inclined plane is a six-fold symmetry plane oriented in the $\{11\text{-}20\}$ plane direction. Hence, the coherent heterointerface between the 3C-SiC layer and the 4H-SiC layer has a triangular segment (3S) exposed on the main surface, separating the 3C-SiC surface (2S) and the surrounding inclined plane (1is) made of 4H-SiC. In the manner as described above, it is possible to obtain a SiC laminate that is free from scattering and trapping of carriers at the interface and does not involve the formation of a twin boundary.

[Embodiments of Power MOSFET and SBD]

Described below are embodiments of a power MOSFET and an SBD using a SiC laminate produced by the SiC laminate production method according to the first and second embodiments.

(Device Manufacturing Process)

Figure 15:
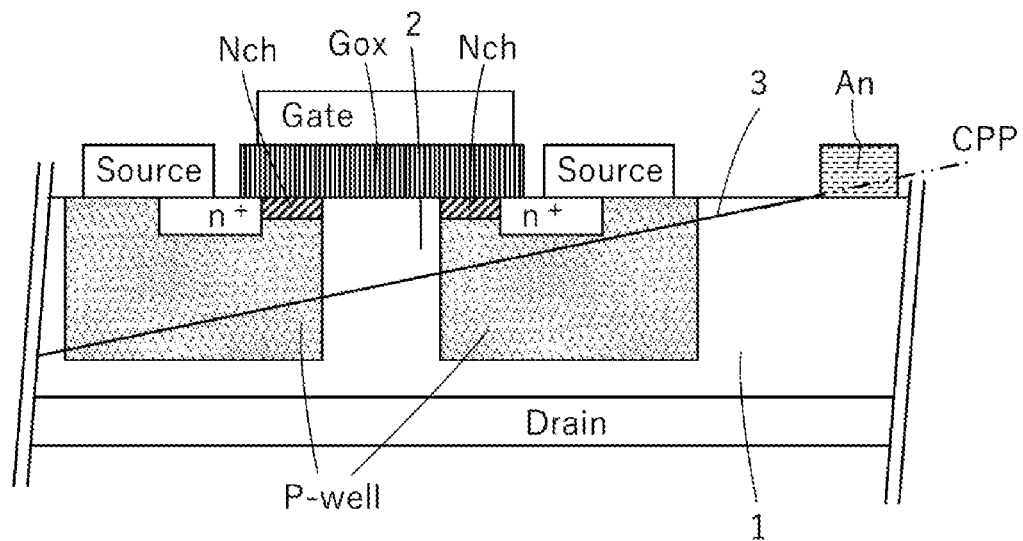
FIG. 15 is a cross-sectional view of the structure of a power MOSFET using a SiC laminate formed by the SiC laminate production method according to the first embodiment of the present invention.
Figure 16:
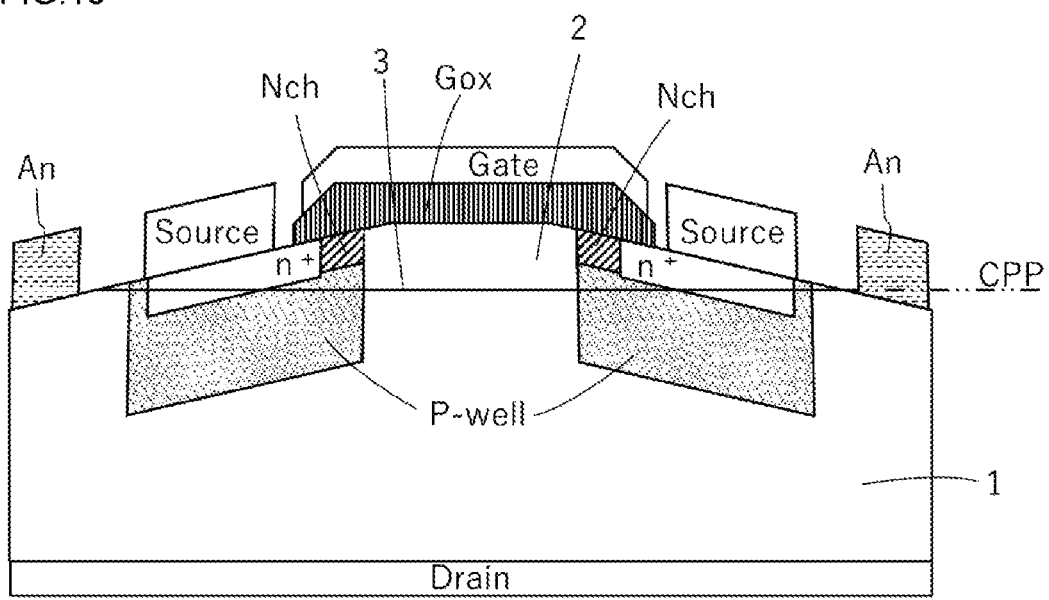
FIG. 16 is a cross-sectional view of the structure of a power MOSFET related to a SiC laminate formed by the SiC laminate production method according to the second embodiment of the present invention.

Using an n-type 4H-SiC substrate with a resistivity of 20 mΩ·cm or less, a SiC laminate having a 3C-SiC layer and a 4H-SiC layer is produced by the SiC laminate production method according to the first and second embodiments. Note that nitrogen doping is performed intentionally in the lateral epitaxy process to obtain an 8 μm thick epitaxially grown layer that contains nitrogen at a concentration of $1 \times 10^{16}/\text{cm}^3$ as a drift layer. Next, aluminum ions are implanted so that the ions penetrate from the 3C-SiC layer (2) to the underlying 4H-SiC layer (1) to provide an acceptor-doped region (P-well) with a concentration of $3 \times 10^{17}/\text{cm}^3$ as illustrated in FIG. 15 (structure according to the first embodiment of the SiC laminate production method) or FIG. 16 (structure according to the second embodiment of the SiC laminate production method). In addition, to reduce the source contact resistance, nitrogen ions and phosphorus ions are implanted into a portion around the surface of the p-well to provide a donor-doped region ($n^+$ region) with a concentration of $1 \times 10^{21}/\text{cm}^3$ or more. After the ion implantation, heat treatment is performed at 1600° C. to 1700° C. for 45 minutes to electrically activate the implanted ions.

After that, thermal oxidation is performed at 1120° C. for 60 minutes in a dry oxygen atmosphere to form a gate oxide film (Gox) with a thickness of 50 nm on the main surface. An opening is formed in a portion of the gate oxide film (Gox), and a Ni electrode is connected to the $n^+$ region as a source electrode (Source). A gate electrode (Gate) made of polycrystalline Si is provided on the gate oxide film (Gox) that covers the p-well from the $n^+$ region. In this process, the gate is formed in a length of 0.8 μm to 3 μm. Then, a drain electrode (Drain) is provided over the entire back surface of the SiC laminate. Further, a metal with a high work function such as Pt, Au, W is deposited on the surface of the 4H-SiC layer by sputtering or vapor deposition to form an anode (An), thereby forming a Schottky barrier diode (SBD) as a freewheeling diode.

(Device Characteristics)

In the n-type MOSFET formed by the above process, a gate electrode (Gate) is formed only on the 3C-SiC layer, and the interface state density (DA) at the MOS interface is less than $5 \times 10^{11}/\text{cm}^2/\text{eV}$. At a gate voltage of 3.2 V or higher, an n-channel (Nch) is formed by an inversion layer and the MOSFET becomes conductive. At a gate voltage of 5 V, the channel mobility is higher than 340 $\text{cm}^2/\text{V/sec}$ at 300 K and exceeds 240 $\text{cm}^2/\text{V/sec}$ at 500 K. Therefore, the channel resistance ($R_{ch}$) is less than 1.3 mΩ·cm at a temperature of 500 K or less, which reduces the conduction loss of the MOSFET.

The lower part of the p-well, where a region with the maximum electric field intensity is formed, is located in the 4H-SiC layer having a band gap ($E_g$) of 3.2 eV. Accordingly, when the applied voltage between the source and the drain is 600 V and the gate voltage is 0 V, the leakage current density between the drain and the source is less than $1.3 \times 10-9$ $\text{A/cm}^2$. Meanwhile, when the gate voltage is 5 V, the density of current flowing between the source and the drain exceeds 730 $\text{A/cm}^2$ in the temperature range of 500 K or less. Thus, it is possible to obtain a low-loss MOSFET in which power loss due to leakage current is sufficiently reduced.

On the surface of the 4H-SiC layer, the anode (An) of the SBD is connected to the source. When the drain potential of the MOSFET drops with respect to the source potential, the SBD becomes conductive as a freewheeling diode and matches the drain potential with the source potential. Since the anode (An) is formed on the 4H-SiC surface with a high band gap, the SBD maintains a breakdown voltage ($V_b$) equal to or higher than that of the MOSFET. There is also almost no accumulation of electric charge as the SBD is a unipolar device. In addition, the threshold voltage at which it becomes conductive is lower than the threshold voltage at which the pn junction in the MOSFET becomes conductive, and therefore, the pn junction in the MOSFET does not become conductive under any circumstances. This prevents the recombination of minority carriers around the p-well, thereby improving the long-term reliability of the MOSFET. Furthermore, the time required for the SBD to become conductive (reverse recovery time) is 8 n seconds or less. Thus, according to the embodiments of the present invention, the semiconductor device has the effect of suppressing the switching loss of the MOSFET.

[Embodiments of CMOS Circuit]

Described below is an embodiment of a CMOS circuit using a SiC laminate of the present invention. In the following embodiment, using an n-type 4H-SiC wafer with a resistivity of 150 Ω·cm or higher, a layered structure having a 3C-SiC layer and a 4H-SiC layer is formed by the SiC laminate production method according to the first embodiment. Note that intentional doping of impurities is not performed in the lateral epitaxy process, and an epitaxially grown layer has a donor concentration of $1\times10^{15}/cm^3$ or less. The epitaxially grown layer formed has a thickness of 5 μm to 10 μm.

(Manufacturing Process for Device and Circuit)

Figure 17:
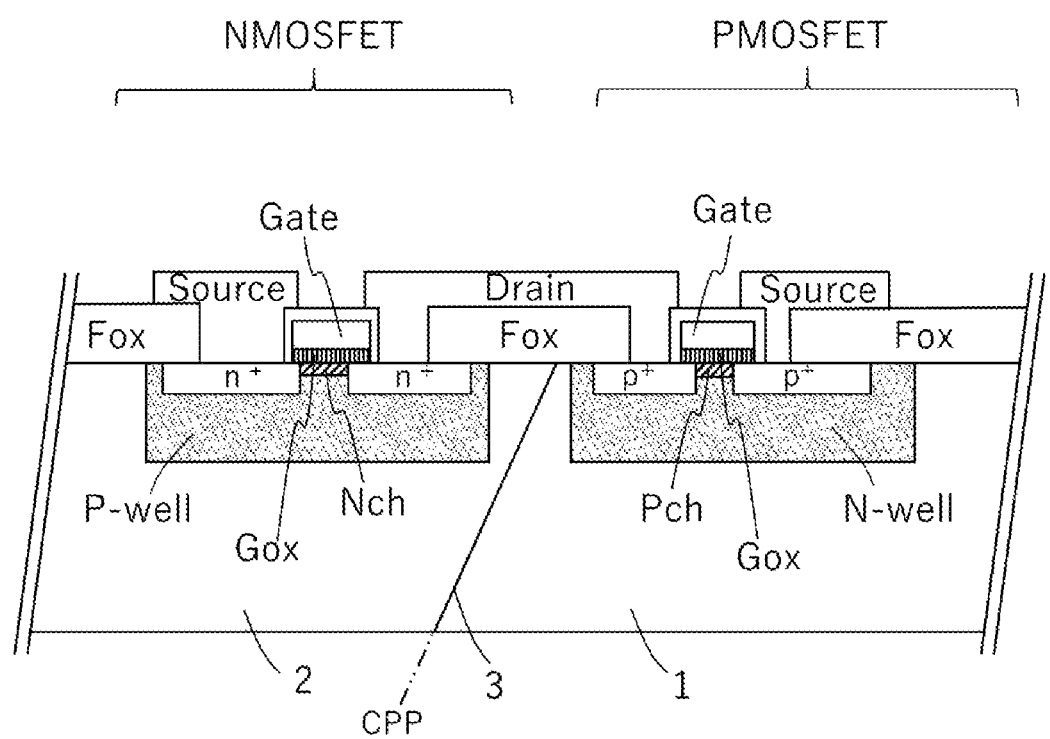
FIG. 17 is a cross-sectional view of the structure of a CMOS circuit related to a SiC laminate formed by the SiC laminate production method according to the first embodiment of the present invention.

Aluminum ions are implanted in part of the 3C-SiC layer and nitrogen ions are implanted in part of the 4H-SiC layer to form a p-well and an n-well as illustrated in FIG. 17. An n-channel MOSFET (NMOSFET) is formed in the p-well region, while a p-channel MOSFET (PMOSFET) is formed in the n-well region. Aluminum concentration and nitrogen concentration are $3\times10^{17}/cm^3$ in the respective regions. Nitrogen ions and phosphorus ions are implanted near the surface of a portion of the p-well, and aluminum ions are implanted near the surface of a portion of the n-well to provide a high-concentration donor-doped region ($n^+$) and a high-concentration acceptor-doped region ($p^+$) for connection with electrodes. The donor concentration of the $n^+$ region is $1\times10^{21}/cm^3$ or more, and the acceptor concentration of the $p^+$ region is $5\times10^{18}/cm^3$ or more. After the above ion implantation, heat treatment is performed at 1600° C. to 1700° C. for at least 45 minutes to electrically activate the implanted ions.

After that, thermal oxidation is performed at 1120° C. for 10 minutes in a dry oxygen atmosphere to form a gate oxide film (Gox) with a thickness of 20 nm on the SiC laminate. In addition, a field oxide film (Fox) with a thickness of 3 μm or more is provided between the n-well and the p-well by the CVD method to electrically isolate the devices from each other. Then, a gate electrode (Gate) made of polycrystalline Si is provided on the gate oxide film (Gox) and used as an input terminal. In this process, the gate is formed in a length of 40 nm to 1 μm. Thereafter, an opening is formed in a portion of the gate oxide film (Gox), and Ni electrodes are connected to the $n^+$ region and the $p^+$ region to be used as a source electrode (Source) and a drain electrode (Drain). In the last step, the drain of the NMOSFET formed on the p-well and the drain of the PMOSFET formed on the n-well are connected together to form a CMOS circuit using this as an output terminal.

(Device Characteristics)

In the CMOS circuit formed by the above process, the source of the NMOSFET region is grounded to the ground potential, and the source of the PMOSFET region is connected to a constant voltage ($V_{dd}$) between 3.3 V and 45.2 V. The PMOSFET and the NMOSFET alternately become conductive depending on the voltage applied to the gate, and accordingly the potential of the drain changes between the ground potential and the voltage $V_{dd}$. The NMOSFET is located in the 3C-SiC layer with an interface state density of less than $5\times10^{11}/cm^2/eV$ with respect to electrons. The PMOSFET is located in the 4H-SiC layer with an interface state density of less than $4\times10^{12}/cm^2/eV$ with respect to holes. As a result, the on-resistance ($R_{on}$) of the NMOSFET is 1.3 mΩ·cm or less, and the on-resistance of the PMOSFET is 3.2 mΩ·cm or less. Thus, the delay time required to invert the output of the CMOS circuit can be 5 n seconds or less. Furthermore, the CMOS circuit of this embodiment has a low subthreshold leakage current and can reduce the standby power loss to 3% or less compared to a Si CMOS circuit having a structure similar to that of this embodiment.

Since the temperature at which SiC becomes an intrinsic semiconductor is higher than 700° C. due to its wide band gap ($E_g$), the CMOS circuit of the embodiment is operable in the temperature range exceeding 220° C. Therefore, when the source of the NMOSFET is connected to a capacitor, a non-volatile memory can be constructed because of the low leakage current.

EXAMPLES (Off Process, Seed Process)

Commercially available single-crystal 4H-SiC wafers (W1, W2, W3, W4, W5) were prepared. The wafers were 6 inches in diameter and had a surface inclined 1 degree in the [11-20] direction from the (0001) plane (Si plane). Each wafer was provided with a first orientation flat (OF1) parallel to the (1-100) plane and a second orientation flat (OF2) parallel to the (11-20) plane.

An image reversal photoresist (AZ5214E) was applied to a thickness of 2 μm on the surfaces of the wafers W1 to W4. Next, 240 linear photoresist (LPR) patterns were defined by exposure with a reduction stepper (Nikon NSR-1505G5D) that utilized a g-line mercury lamp (wavelength 436 nm) as its light source. At this time, the angles of the wafers W1, W2, and W4 were adjusted such that the LPR patterns were deflected by 0.5 degrees or less relative to the OF2, and the angle of the wafer W3 was adjusted such that the LPR patterns were deflected counterclockwise by 8 degrees from the OF2. The LPR patterns on the 4H-SiC wafers W1, W3, and W4 were formed to be continuous from the OF1 side to the other side, while the LPR patterns on the wafer W2 were provided with 1 mm unexposed portions (discontinuous portions) at 10 mm intervals in a <1-100> direction by adjusting the step size of the stepper. The spacing (space width) between adjacent LPR patterns was 30 μm, and the minimum width of the LPR patterns was 1.3 μm.

The photoresist was developed by a reverse bake at 180° C. for 5 minutes and overall exposure to the g-line of the mercury lamp to obtain LPR patterns each having an inversely tapered cross section with a flange width of 0.5 μm.

Dry etching was performed on the wafers W1 to W4 using a parallel plate RF dry etching system. In this process, $CF_4$ gas and $O_2$ gas were introduced into the dry etching system at flow rates of 40 sccm and 10 sccm, respectively, and plasma was generated by applying 100 W RF power at 13.56 MHz while the pressure was maintained at 40 Pa. By 25 seconds of the dry etching, SiC exposed at a location corresponding to the space width of the resist patterns was etched to a depth of 35 nm and removed. Inclined planes were formed on the SiC surface covered by the flanges of the resist patterns, and their inclination angle was 4 degrees.

After that, ashing was performed for 15 minutes with oxygen plasma generated at an input power of 100 W using an asher to completely remove the LPR patterns. This was followed by 5 minutes of SPM cleaning and 3 minutes of rinsing with pure water to remove resist residues, fine particles, and metal contaminants from the surface.

(Surface Structure Stabilization Process)

The wafers W1, W2, W3, and W5 were vertically fixed to a quartz boat, and the boat was placed in a horizontal quartz vessel. Then, the air in the quartz vessel was replaced with nitrogen gas, and the pressure was maintained at 970 hPa as hydrogen gas was introduced into the quartz vessel at a flow rate of 3 slm. Note that the hydrogen introduced was purified through a purification system using a permeable membrane made of platinum-palladium to ensure its purity of 99.999999% or higher. The flow rate and pressure of the hydrogen gas were adjusted by a method generally used for thermal diffusion and thermal oxidation of Si, and therefore a detailed description thereof is omitted herein.

Next, the entire quartz vessel was heated to 500° C. by energizing a resistance heater surrounding the outside of the quartz vessel and controlling the current value. After the temperature of the reaction vessel reached 500° C., the temperature was maintained for 5 hours, and then the power supply to the heater was turned off. The supply of hydrogen was stopped after the temperature of the quartz vessel dropped to 100° C. or less. The SiC wafers placed on the boat were taken out after the atmosphere inside the quartz vessel was replaced with nitrogen gas.

(Epitaxial Growth Process)

Epitaxial growth was performed on the wafers W1 to W5 under the same conditions using a SiC epitaxial growth system (NuFlare Technology, Inc. EPIREVO S6).

In the epitaxial growth, each of the wafers was placed face up on a graphite susceptor coated with polycrystalline SiC in a reactor. Then, while the wafers were rotated at 800 rpm, 5 slm of hydrogen was introduced to maintain the pressure at 300 hPa and the wafer temperature was raised to 1650° C. Immediately after the wafer temperature reached 1650° C., additional monosilane gas and propane gas were fed into the reactor at flow rates of 50 sccm and 13 sccm, respectively, and epitaxial growth was carried out for 3 minutes while the pressure was maintained at 300 hPa. After that, the supply of monosilane gas and propane gas was stopped. When the wafer temperature reached 700° C. or lower, the supply of hydrogen gas was stopped, and the wafers were taken out from the reactor. Fourier transform infrared spectroscopy (FT-IR) confirmed that an epitaxially grown SiC layer had a thickness of 0.6 µm. In addition, Hall effect measurement indicated that the epitaxially grown layer had an n-type conductivity, and the carrier concentration at room temperature was $7 \times 10^{15}/cm^3$.

Layered Structure)

After the epitaxial growth, the crystal structure of SiC exposed on the wafer surface and its orientation or direction were observed by electron backscatter diffraction (EBSD). As a result of the observation, 3C-SiC and 4H-SiC were found on the surfaces of the wafers W1, W2, W3 and W4, while only 4H-SiC was found on the surface of the wafer W5. This indicates that, when a seed plane is formed by the SiC laminate production method according to an embodiment of the present invention, 3C-SiC is formed on the top of the seed plane, and step-controlled epitaxy occurs on the inclined planes.

Through the EBSD analysis for the wafers W1, W3, and W4, it was detected that the 3C-SiC surface had a width of 18 µm in the [11-20] direction, while the 4H-SiC surface had a width of 13 µm. From this, it was found that the 3C-SiC two-dimensionally nucleated on the seed plane grew in a direction parallel to a close-packed plane by step-controlled epitaxy. On the other hand, the EBSD analysis for the wafer W2 showed that the 3C-SiC surface had a discontinuity in the [110] direction, and the 4H-SiC surface appeared at the discontinuity of 3C-SiC. The boundary between 3C-SiC and 4H-SiC found here is not perpendicular to the inclination direction, indicating that the boundary includes an incoherent interface.

(Carrier Lifetime)

On the wafers W1 to W4, the time taken for excess carriers to disappear at the boundary between the 3C-SiC surface and the 4H-SiC surface was measured by the microwave photoconductive decay (µ-PCD) method. In the µ-PCD method, a laser beam with a wavelength of 355 nm was focused to a diameter of 1 µm and adjusted such that its center was located on the boundary between the 3C-SiC surface and the 4H-SiC surface. The lifetime of carriers generated by the excitation of laser light was then measured based on the decay time of reflected microwave intensity. Since 3C-SiC has an electron affinity about 1 eV higher than that of 4H-SiC, electrons generated by laser light excitation diffuse toward the 3C-SiC side, and holes diffuse toward the 4H-SiC side. As a result, the electrons and holes are spatially separated, which extends the lifetime of carriers. However, if the interface between 3C-SiC and 4H-SiC includes an incoherent interface that causes carrier recombination, the carrier lifetime is reduced according to the density.

Table 1 shows the carrier lifetime measured by the µ-PCD method together with production conditions and results of the EBSD analysis for each wafer. It is clear from the table that the carrier lifetime is significantly longer on the wafers (W1, W3, W4) with continuous inclined planes. On the wafer W2 where inclined planes have a discontinuity, an incoherent interface is generated at the discontinuity, which promotes the recombination of electrons and holes, resulting in a shorter carrier lifetime. In addition, the more the division direction maintained an orthogonal relationship to the inclination direction, the more the recombination of carriers was suppressed, extending the carrier lifetime. In view of the foregoing, it has been proven that the SiC laminate of the present invention suppresses the trapping and recombination of carriers in a semiconductor device and improves the characteristics of the semiconductor device.

TABLE 1

| Wafer No. | Inclined Plane | Surface Structure Stabilization Process | Interface between 3C—SiC and 4H—SiC | Carrier Lifetime ($\times 10^{-9}$ sec.) |
|---|---|---|---|---|
| W1 | Continuous | Performed | Coherent | 2032 |
| W2 | Discontinuous | Performed | Coherent and incoherent | 74 |
| W3 | Continuous with deviated division direction | Performed | Coherent | 776 |
| W4 | Continuous | Not performed | Coherent | 1811 |
| W5 | Positive inclination only | Performed | No interface | |

Pole figures were observed by X-ray diffraction on the wafers W1, W3, and W4. The results showed that the (111) plane of the 3C-SiC layer and the (0001) plane of the 4H-SiC layer were exactly parallel and that three-fold symmetry planes selected from the {11-2} planes of the 3C-SiC layer and the {11-20} planes of the 4H-SiC layer were exactly parallel. This indicates that three-fold symmetry planes selected from the {-1-11} planes of 3C-SiC and the {0-33-4} planes of 4H-SiC are exactly parallel, and the 3C-SiC layer does not contain a twin boundary. On the other hand, in the pole figure of the wafer W2, there was found a portion where the (111) pole of 3C-SiC and the (0001) pole of 4H-SiC had different angles. From this, it can be seen that the interface between 3C-SiC and 4H-SiC formed on the wafer W2 contains an incoherent interface.

Meanwhile, in the pole figure of the wafer W4, the (−1-11) planes of discrete 3C-SiC layers were not always parallel and were found to have a rotational relationship of 120 degrees. Thus, it was found that the 3C-SiC layers have a twinning relationship. That is, the surface structure stabilization process of the present invention is necessary to equalize the close-packed structure of all 3C-SiC layers.

As described above, it is possible to obtain a laminate of hexagonal SiC and 3C-SiC by performing step-controlled epitaxy after forming a seed plane. In addition, by providing no discontinuity to inclined planes adjacent to the seed plane, the continuity of the crystal lattice is maintained at the interface between hexagonal SiC and 3C-SiC, and only a coherent heterointerface can be obtained. Furthermore, it has been found that stabilizing the surface structure of seed planes prior to step-controlled epitaxy prevents a twin boundary from occurring even when 3C-SiC layers extending from different seed planes meet each other.

(MOS Interface Characteristics)

All the above wafers were thermally oxidized at 1120° C. for 60 minutes in a dry oxygen atmosphere to form a Si oxide film with a thickness of 50 nm on the main surface. Then, Ni electrodes with a diameter of 1 µm were deposited on the Si oxide film. The Ni electrodes were arranged in a grid with a spacing of 1 µm. In the wafers W1, W3, and W4, a 3C-SiC surface with a width of 2.3 µm and a 4H-SiC surface with a width of 2 µm are both present on the main surface. Therefore, it is possible to select an electrode ($E_{3C}$) located only on the surface of the 3C-SiC layer or an electrode ($E_{4H}$) located only on the surface of the 4H-SiC layer.

Next, the conductance method was used to measure the MOS interface state density around the conduction bands of the electrodes $E_{3C}$ and $E_{4H}$ on each wafer. After measuring the interface state density, the dielectric breakdown field strength of the Si oxide film was measured as the voltage applied to the electrodes was continuously increased from 0 V to 60 V at room temperature. Table 2 shows the interface state density and dielectric breakdown field strength for each of the electrodes $E_{3C}$ and $E_{4H}$ on each wafer.

TABLE 2

| Wafer No. | MOS Interface State Density ($\times 10^{12}$ cm$^{-2}$/eV) | | Dielectric Breakdown Field Strength (MV/cm) | |
| --- | --- | --- | --- | --- |
| | $E_{3C}$ | $E_{4H}$ | $E_{3C}$ | $E_{4H}$ |
| W1 | 0.3 | 42.7 | 11.8 | 10.2 |
| W2 | 0.8 | 42.8 | 5.3 | 6.4 |
| W3 | 0.3 | 31.0 | 11.9 | 11.3 |
| W4 | 0.5 | 80.2 | 9.1 | 9.1 |
| W5 | | 17.4 | | 11.5 |

As can be seen in Table 2, the state density of the MOS interface formed in 3C-SiC is reduced to ⅟30 or less of that of 4H-SiC. That is, the channel resistance decreases in an n-channel MOSFET manufactured in a 3C-SiC layer according to an embodiment of the present invention, and it is possible to obtain a semiconductor device with significantly reduced power loss. The effect of reducing the interface state density is particularly pronounced in the wafers (W1, W3) having seed planes subjected to the surface structure stabilization process.

Furthermore, since the wafers W1, W3, and W4 do not has an incoherent interface at the interface between 3C-SiC and 4H-SiC, the electric field distribution is uniform at the MOS interface, and the high dielectric breakdown field strength is achieved on the 3C-SiC surface and the 4H-SiC surface. This clearly indicates that the SiC laminate of the present invention is effective in improving the long-term reliability of semiconductor devices.

Although specific embodiments of the invention have been described and illustrated, it is to be understood that the invention is not limited to the embodiments disclosed herein. Various changes, modifications, and alterations may be made within the scope of the invention as defined in the appended claims. For example, the polytype of hexagonal SiC is not limited to 4H-SiC. 6H-SiC or 15R-SiC may also be used to obtain a coherent heterointerface with a 3C-SiC layer, and a low-loss semiconductor device can be achieved. In addition, the shape of the seed plane is not limited to a straight line with a trapezoidal cross section or a truncated cone. As long as the inclined plane is at a depression angle of 0.5 degrees or more and less than 73 degrees with respect to the seed plane and has no discontinuity, the same results as in the embodiments can be obtained regardless of the shape of the seed plane. The temperature, pressure, and gas flow rate in the lateral epitaxy process are also not limited to those described in the above embodiments and examples, and optimal conditions can be appropriately adjusted as necessary.

INDUSTRIAL APPLICABILITY

The SiC laminate of the present invention can be used as a substrate for power semiconductor devices, such as MOSFETs, insulated-gate bipolar transistors (IGBTs), bipolar transistors, p-n diodes, and SBDs, high-speed logic circuits with CMOS, and microelectromechanical systems (MEMS) devices. Furthermore, taking advantage of the features of the coherent heterointerface where different band gaps and electron affinities meet, the SiC laminate can also be used as a substrate for high-frequency devices, such as heterojunction bipolar transistors (HBTs) and high-electron-mobility transistors (HEMTs), and high-efficiency solar cells.

LIST OF REFERENCE SIGNS

1 Hexagonal SiC layer
1S Hexagonal SiC surface
1i, 1is, 1iu, 1iv, 1iw Inclined plane
1if Positively inclined plane
1ib Negatively inclined plane
1p Seed plane on hexagonal SiC layer
1pb, 1pf Partial inclined plane
1r Ridge portion
1v Valley portion
1pr Discontinuous ridge portion
1pv Discontinuous valley portion
1N Crystal lattice plane having three-fold symmetry relationship selected from {0-33-n} planes of hexagonal SiC
2 3C-SiC layer
2S 3C-SiC surface
2p Seed plane on 3C-SiC layer
2e Two-dimensional nucleus of 3C-SiC
2N {−1-11} plane of 3C-SiC
3 Coherent heterointerface
3S Segment of coherent heterointerface on main surface
3J Segment of incoherent interface on main surface S Main surface
CPP Close-packed plane of crystal lattice
θ Inclination angle
θf Initial inclination angle of vicinal wafer
θp Depression angle of inclined plane with respect to seed plane
If Positive inclination direction
Ib Negative inclination direction
Ix Division direction
L Minimum length of inclined plane projected onto close-packed plane of crystal lattice in inclination direction
Wc Critical width
te Thickness of two-dimensional nucleus of 3C-SiC formed on seed plane
d Height difference of inclined plane
OX Si oxide film
LPR Linear photoresist pattern
CPR Circular photoresist pattern
TR Trench on SiC surface
Wh Width of flange of linear photoresist pattern
NMOSFET N-channel field effect MOS transistor
Nch Channel region of NMOSFET
PMOSFET P-channel field-effect MOS transistor
Pch Channel region of PMOSFET
Gox Gate oxide film
Fox Field oxide film
An Anode of SBD
P-well Acceptor-doped region
N-well Donor-doped region

The invention claimed is:

1. A SiC laminate, comprising:
a single crystal hexagonal SiC layer; and
a single crystal 3C-SiC layer overlaid on the hexagonal SiC layer, wherein
the 3C-SiC layer does not contain a twin boundary,
a heterointerface where the 3C-SiC layer and the hexagonal SiC layer meet is exactly parallel to close-packed planes (CPPs) of crystal lattices of the layers and is a lattice-matched coherent heterointerface,
the coherent heterointerfaces is exposed on a main surface at an inclination angle of 0.5 degrees or more and less than 73 degrees, and
a segment of the coherent heterointerface on the main surface is a polygon or a straight line with no endpoint and separates a hexagonal SiC surface and a 3C-SiC surface.

2. The SiC laminate according to claim 1, wherein when close-packed planes (CPPs) of a crystal lattice of the hexagonal SiC layer are stacked with a periodicity of n molecular layers (n is a natural number), {−1-11} planes of a crystal lattice of the 3C-SiC layer are each parallel to each of crystal lattice planes having a three-fold symmetry relationship selected from {0-33-n} planes of the crystal lattice of the hexagonal SiC layer.

3. A production method for the SiC laminate according to claim 1, comprising:
a seed process of forming a seed plane parallel to a close-packed plane (CPP) of a crystal lattice in one or more regions on a surface of the hexagonal SiC layer;
an off process of providing an inclined plane inclined at a positive depression angle of 0.5 degrees or more and less than 73 degrees with respect to the seed plane to all faces adjacent to the seed plane;
a nucleation process of forming a two-dimensional nucleus of 3C-SiC on the seed plane; and
a lateral epitaxy process of epitaxially growing both the two-dimensional nucleus of 3C-SiC and the SiC layers exposed on the inclined plane simultaneously in a direction parallel to the close-packed plane (CPP) of the crystal lattice.

4. The production method according to claim 3, wherein the inclined plane is arranged so as to divide the surface of the hexagonal SiC layer in the off process,
at least one inclined plane is a positively inclined plane inclined in a specific positive inclination direction, and
at least one inclined plane is a negatively inclined plane inclined in a negative inclination direction opposite to the positive inclination direction.

5. The production method according to claim 4, further comprising:
matching the positive inclination direction to either a <11-20> direction or a <1-100> direction of the hexagonal SiC layer; and
extending a ridge portion and a valley portion each corresponding to a boundary between the positively inclined plane and the negatively inclined plane, linearly in a division direction of 88 degrees or more and 92 degrees or less from the positive inclination direction.

6. The production method according to claim 3, wherein a thickness of the two-dimensional nucleus of 3C-SiC formed on the seed plane is less than a product of tangent of the inclination angle and L, where L is a minimum length in an inclination direction of a plane obtained by projecting each of inclined planes onto the close-packed plane (CPP) of the crystal lattice.

7. The production method according to claim 3, further comprising a surface structure stabilization process of exposing the seed plane to a hydrogen gas pressure of 700 hPa or higher at a temperature of 300° C. to 550° C. for 1 hour or more prior to the nucleation process.

8. A semiconductor device using the SiC laminate according to claim 1, comprising:
one or more n-channel metal-oxide-semiconductor field-effect transistors (NMOSFETs),
wherein a channel region of the NMOSFETs is formed only in the 3C-SiC layer.

9. A semiconductor device using the SiC laminate according to claim 1, comprising:
one or more p-channel metal-oxide-semiconductor field-effect transistors (PMOSFETs),
wherein a channel region of the PMOSFETs is formed only in the hexagonal SiC layer.

10. A semiconductor device using the SiC laminate according to claim 1, comprising:
one or more Schottky barrier diodes (SBDs),
wherein an anode of the SBDs is formed only on the hexagonal SiC surface.

* * * * *